United States Patent
Kato et al.

(10) Patent No.: US 7,388,384 B2
(45) Date of Patent: Jun. 17, 2008

(54) METHOD AND SYSTEM FOR MONITORING PARTIAL DISCHARGE IN GAS-INSULATED APPARATUS

(75) Inventors: Tatsuro Kato, Hitachi (JP); Tomohiro Moriyama, Hitachi (JP); Fumihiro Endo, Nagoya (JP)

(73) Assignee: Japan AE Power Systems Corporation, Tokyo (JP)

( * ) Notice: Subject to any disclaimer, the term of this patent is extended or adjusted under 35 U.S.C. 154(b) by 0 days.

(21) Appl. No.: 11/304,673

(22) Filed: Dec. 16, 2005

(65) Prior Publication Data

US 2006/0132144 A1 Jun. 22, 2006

(30) Foreign Application Priority Data

Dec. 16, 2004 (JP) ............................ 2004-363973

(51) Int. Cl.
*G01R 31/08* (2006.01)
(52) U.S. Cl. ........................ 324/536; 324/512
(58) Field of Classification Search ................ 324/536
See application file for complete search history.

(56) References Cited

U.S. PATENT DOCUMENTS

| | | | | | |
|---|---|---|---|---|---|
| 3,891,862 | A | * | 6/1975 | Clark | ......................... 307/125 |
| 4,620,145 | A | * | 10/1986 | Dietz et al. | ................. 324/519 |
| 4,710,705 | A | * | 12/1987 | Kawabata | .................... 324/102 |
| 5,200,737 | A | * | 4/1993 | Konishi et al. | ............. 340/644 |
| 5,256,976 | A | * | 10/1993 | Ishikawa | .................... 324/522 |
| 6,424,162 | B1 | * | 7/2002 | Rokunohe et al. | .......... 324/551 |
| 6,850,399 | B1 | | 2/2005 | Kato | ......................... 361/93.1 |
| 6,853,528 | B2 | | 2/2005 | Kato | ......................... 361/93.1 |
| 2003/0214307 | A1 | * | 11/2003 | Kang | ......................... 324/536 |
| 2005/0135028 | A1 | | 6/2005 | Kato | ......................... 361/93.1 |
| 2005/0135029 | A1 | | 6/2005 | Kato | ......................... 361/93.1 |
| 2005/0184737 | A1 | | 8/2005 | Moriyama | ................... 324/536 |

(Continued)

FOREIGN PATENT DOCUMENTS

JP 07-049362 2/1995

(Continued)

OTHER PUBLICATIONS

U.S. Appl. No. 11/153,491, filed Jun. 2005, Shinohara, et al.

*Primary Examiner*—Andrew H Hirshfeld
*Assistant Examiner*—Jeff Natalini
(74) *Attorney, Agent, or Firm*—Mattingly, Stanger, Malur & Brundidge, P.C.

(57) ABSTRACT

A gas-insulated apparatus is equipped with multiple sensors for sensing a partial discharge signal caused by a foreign substance, and a frequency analyzing section for analyzing the frequency of the sensed partial discharge signal. A defect type judging section estimates the defect type of the foreign substance from the signal obtained through the frequency analysis or from the voltage phase distribution of partial discharge synchronized with the frequency of the voltage applied to the gas-insulated apparatus, and a location determining section estimates the defect location and signal intensity from the multiple partial discharge signals. A defect size calculating section estimates the defect size for each defect type from the signal intensity and field distribution at the defect location. Dielectric breakdown risk evaluation is performed based on the defect size and type, and the insulation failure risk is diagnosed from the partial discharge.

9 Claims, 20 Drawing Sheets

U.S. PATENT DOCUMENTS

2005/0285604 A1* 12/2005 Shinohara et al. .......... 324/557

FOREIGN PATENT DOCUMENTS

| JP | 7-50147 | 5/1995 |
| JP | 10-170596 | 6/1998 |
| JP | 2000-224723 | 8/2000 |
| JP | 3299547 | 4/2002 |

* cited by examiner

SENSOR a

SENSOR b

SENSOR a

SENSOR b

FIG. 19

| DEFECT TYPE: | PROTRUSION |
|---|---|
| LOCATION: | BETWEEN DISCONNECTING SWITCH DS1 AND CIRCUIT BREAKER CB1 |
| DISCHARGE LEVEL: | 1.0pC |
| RISK LEVEL | ■ ■ ■ □ □ |
| GUIDANCE: | INSPECTION WITHIN A MONTH IS NEEDED<br>TREND MONITORING SHALL BE CONTINUED |

FIG. 20

| RISK LEVEL | GUIDANCE |
|---|---|
| Risk5 | EMERGENCY STOP |
| Risk4 | OVERHAUL INSPECTION WITHIN A WEEK |
| Risk3 | INSPECTION WITHIN A MONTH<br>CONTINUED TREND MONITORING |
| Risk2 | PERIODIC MONITORING IS NEEDED (WEEKLY) |
| Risk1 | BREAKDOWN RISK IS LOW BUT PERIODIC MONITORING IS NEEDED (MONTHLY) |

FIELD STRENGTH ALONG SPACER SURFACE

TANK-BOTTOM FIELD STRENGTH

FIG. 23

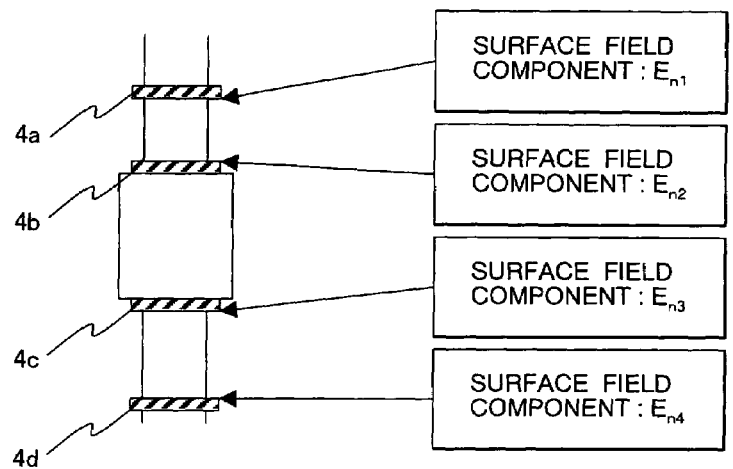

FIG. 24

| DEFECT | CHARACTERISTIC OF DISCHARGE | GUIDANCE |
|---|---|---|
| VOID | DISCHARGE LIVEL IS LOW BUT WILL PROGRESS FOR AGED DETERIORATION | BREAKDOWN WILL NOT OCCUR SHORTLY BUT A RISK OF BREAKDOWN DUE TO REPEATED OVERVOLTAGE EXISTS. CONTINUOUS MONITORING IS NEEDED SO AS TO RECOGNIZE THE BEGINNING OF TREE. |
| FLOAT | SIGNAL EXCEEDING SEVERAL-HUNDRED pC HAS OCCURRED | RISK EXISTS IF THE ELECTRODE HAS DETERIORATED OR MELTED. PERIODIC MONITORING IS NEEDED. |
| ABNORMAL ENERGIZATION | SIGNAL EXCEEDING SEVERAL-THOUSAND pC HAS OCCURRED | ONCE THIS OCCURS, IT PROGRESSES QUICKLY DEPENDING UPON THE ENERGIZATION CONDITION. |
| CRACK | SIGNAL INTENSITY DEPENDS ON THE CRACK STATUS | THERE IS A HIGH RISK OF GAS LEAKAGE, AND THE APPARATUS SHOULD BE TURNED OFF ONCE IT IS SENSED. |

METHOD AND SYSTEM FOR MONITORING PARTIAL DISCHARGE IN GAS-INSULATED APPARATUS

CLAIM OF PRIORITY

The present application claims priority from Japanese application ser. No.2004-363973, filed on Dec. 16, 2004, the contents of which is hereby incorporated by references into this application.

BACKGROUND OF THE INVENTION

1. Field of the Invention

The present invention relates to a partial discharge monitoring method and system to diagnose failure condition of a gas-insulated apparatus by sensing partial discharge caused inside the gas-insulated apparatus.

2. Prior Art

As power supply increases and substation facilities become more compact recently, gas-insulated apparatus filled with high-pressure $SF_6$ gas of which electrical insulation performance, current limiting performance and reliability are very excellent has been popularized.

While $SF_6$ gas filled in a gas-insulated apparatus exhibits excellent insulation characteristic, the insulation characteristic degrades drastically in a non-uniform field. This is mostly caused by internal failures, particularly mixture of foreign substance in the apparatus, protrusion formed on internal conductor, and void in insulated spacer. If any of this internal failure exists, partial discharge is caused and may progress when applied with high voltage or when subjected to overvoltage such as lightning, possibly resulting in dielectric breakdown in the end.

Accordingly, one of effective means for preventing dielectric breakdown accident is to sense partial discharge, premonitory symptom of dielectric breakdown, sensitively and several sensing methods based on electromagnetic wave, sound, light or producted gas have been proposed. In particular, since a method that employs electromagnetic wave signals in the frequency band from several-hundred MHz to several GHz is hard to be affected by noise, vital research and development has been made on it as a method for sensitive partial discharge sensing.

These sensors for electromagnetic wave, installed in a gas-insulated apparatus as disclosed in the Patent Document 1, for example, realizes sensitive sensing of electromagnetic wave due to partial discharge. In this method using electromagnetic wave, the frequency of the signal sensed by the sensor is analyzed in a frequency band with less noise, from several-hundred MHz to several GHz, and existence of partial discharge signal is checked. In addition to the method using frequency analysis, as disclosed in the Patent Document 2, there has been proposed a method for determining the occurrence of partial discharge from the phase pattern that is synchronized with the phase of commercial frequency voltage being applied. Furthermore, another method employing an estimation technique such as neural network to determining defect type from the sensed signal has also been proposed as disclosed in the Patent Document 3.

There are some other methods for specifying the location of occurrence of partial discharge; including a method for determining the location from the difference of time in reaching two sensors and, as disclosed in the Patent Document 4, a method for estimating the location of partial discharge inside a gas-insulated apparatus by utilizing the attenuation characteristic of electromagnetic wave signal.

There has also been proposed another method, as disclosed in the Patent Document 5, with which a signal resulting from insulation failure, energization failure or mixture of fine foreign substance is sensed and the failure is diagnosed collectively in an expert system by comparing the signal with stored past signal data and the remedial action guidance and life expectation based on the result are displayed. To be concrete, the patent describes that the length of defect can be estimated from the correlation between the voltage applied to the gas-insulated apparatus and discharge level. According to studies later on, however, it has been found that the characteristic of applied voltage vs. discharge level does not correspond to the defect size in most cases.

[Patent Document 1] Patent Publication No. 3299547

[Patent Document 2] Japanese Application Patent Laid-open Publication No. HEI 10-170596 (1998)

[Patent Document 3] Japanese Application Patent Laid-open Publication No. 2000-224723

[Patent Document 4] Japanese Patent Publication No. HEI 7-50147 (1995)

[Patent Document 5] Japanese Application Patent Laid-open Publication No. HEI 7-49362 (1995)

SUMMARY OF THE INVENTION (Problems to be Solved by the Invention)

According to conventional partial discharge measurement, the risk to the insulation of gas-insulated apparatus is evaluated based on the intensity of the measured partial discharge. That is to say, discharge level representing the intensity of discharge is measured and, if a discharge level exceeding a specified threshold (100 pC, for example) is measured, it is regarded as a failure signal.

In case of a defect such as float electrode, however, the possibility of dielectric breakdown can be extremely low even if a high signal in excess of several-thousand pC is caused. In case of a defect such as protrusion, it is known that, even though the same discharge level is caused, the risk of dielectric breakdown may be different depending upon the location of the discharge.

In other words, evaluation based only on the discharge level is not enough to evaluate the actual risk condition of apparatus and exact evaluation of the risk condition is necessary to ensure the reliability of the gas-insulated apparatus. In addition, there is a problem that exact check is hard to achieve because the frequency component and intensity of the electromagnetic wave caused by partial discharge depend upon the circuit configuration of the gas-insulated apparatus and size of the metallic container.

In view of the problems in the above prior arts, an object of the present invention is to offer such a partial discharge monitoring method and system for gas-insulated apparatus that can sense partial discharge sensitively and diagnose the condition of insulation failure exactly.

(Means for Solving the Problems)

In order to solve the above problems, with the method of the present invention for monitoring partial discharge in a gas-insulated apparatus and diagnosing defect by sensing the partial discharge signal caused by defect, defect size is estimated based on the intensity of the sensed partial discharge signal and the field distribution at the location of the defect deduced from the structural dimension of the gas-insulated apparatus. Particularly in case the defect is a protrusion, the field distribution is based on field strength and field unevenness factor.

Otherwise, the frequency of the sensed partial discharge signal is analyzed and defect type of the defect is estimated based on the analyzed waveform of the frequency analysis or from the voltage phase distribution (pattern) of the partial discharge synchronized with the frequency of the voltage applied to the gas-insulated apparatus, and also defect location and signal intensity is estimated based on the multiple partial frequency signals, and then defect size is estimated for each estimated defect type based on the signal intensity and field distribution at the defect location. In addition, the field distribution at the defect location is obtained from the correlation, predetermined for each defect type, between the defect location, conductor surface field strength and field unevenness factor.

A partial discharge monitoring system of a gas-insulated apparatus of the present invention comprises a frequency analyzing section that analyzes the frequency of the signal from the partial discharge sensors installed in the gas-insulated apparatus, a defect type judging section that judges defect type from the signal obtained through the frequency analysis, a location determining section that determines defect location from multiple sensed signals, and a defect size calculating section that calculates defect size from the defect type and location obtained as above, measured signal intensity, and structure of the gas-insulated apparatus.

The system is further equipped with a risk evaluating section that evaluates risk of dielectric breakdown based on the defect size and type.

The operation of the present invention is described hereunder. According to the study of the inventor et al., however, the discharge level, i.e. intensity of discharge depends not on the applied voltage but on the field distribution at the location of the defect. That is, in order to estimate the length of defect exactly, a method based on the field distribution at the location where the defect exists must be employed. In short, where the defect type is protrusion, the field strength and field unevenness factor at the location of the defect are employed because the field distribution can be represented effectively. Where the defect type is foreign substance caught on a spacer surface, the field intensity along the spacer surface is employed. Thus, the exact length of defect can be calculated.

For the partial discharge check, the present invention is provided with a structure database containing the structure of the gas-insulated apparatus, field intensity and field unevenness factor at each location, and field intensity along the spacer surface. The invention is also provided with a defect type database used for defect type judgment, determination database containing the attenuation of electromagnetic wave propagation used for location determination, and defect size database containing the correlation between the defect size and discharge level used for defect size calculation. In addition, an overvoltage breakdown database and long-time breakdown database necessary for risk evaluation are also provided. The condition of the gas-insulated apparatus can be checked very accurately by utilizing these databases.

When the signal intensity is calculated by the frequency analysis of the electromagnetic wave of the partial discharge, the result depends upon the frequency band in the measurement and size of the metallic container (tank). Accordingly, the measured signal intensity is converted into that of a reference frequency and tank size. Consequently, the foreign substance size can be estimated accurately and hence the failure condition of the gas-insulated apparatus can be obtained very accurately, enabling high-reliability maintenance.

(Effects of the Invention)

The present invention achieves an effect that the condition of insulation failure in a gas-insulated apparatus can be checked exactly and that guidance on maintenance can be provided based on the obtained risk level. In other words, it becomes possible to inspect the apparatus at the time when partial discharge is sensed and the risk level exceeds a specified level, allowing a step ahead of maintenance in the form of periodic inspection. Accordingly, maintenance cost can be reduced drastically.

BRIEF DESCRIPTION OF DRAWINGS

[FIG. 19] Explanatory figure of an example display of the check result

[FIG. 20] Explanatory figure of example guidance in each risk level

[FIG. 23] Structural diagram of structure database in case of foreign substance caught on the spacer surface

[FIG. 24] Explanatory figure showing the discharge characteristic of various defect types and example guidance

DETAILED DESCRIPTION OF THE INVENTION

Description of the Preferred Embodiment

A preferred embodiment of the present invention is described in detail hereunder, using drawing figures.

Embodiment 1

Figure 30:
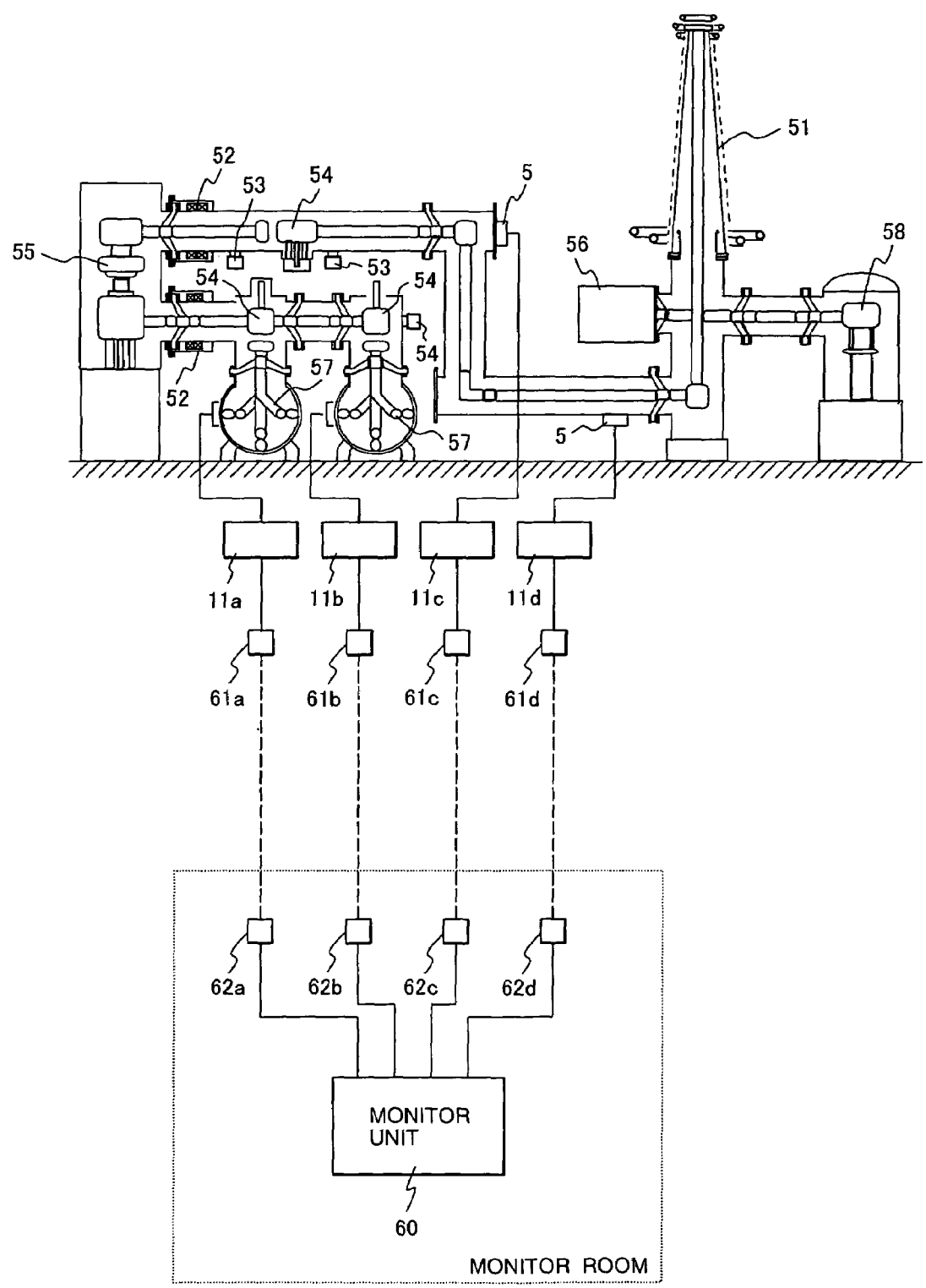
[FIG. 30] Construction of gas-insulated switching apparatus and brief partial discharge check system

FIG. 30 shows a construction of a gas-insulated switching apparatus to which the present invention applies, showing a system configuration capable of continuous monitoring. The gas-insulated switching apparatus is a metallic container with ground potential, which contains a circuit breaker 55, disconnecting switch 54, grounding switch 53, bus 57, arrestor 58, current transformer 52, and transformer 56, and is filled with $SF_6$ gas having excellent insulation performance and current limiting performance.

Power is led into the apparatus from an overhead wire or power cable via a bushing 51 or cable head, and supplied to the bus 57, disconnecting switch 54 and circuit breaker 55. The arrestor 58 for controlling overvoltage due to lightning is installed near the bushing for incoming power, and the transformer 56 for measuring the voltage and current transformer 52 for measuring the current are installed at appropriate positions.

Since existence of any insulation failure inside the gas-insulated apparatus as constructed above results in a short-circuit accident, preventing the failure is very important. Because the gas-insulated apparatus is particularly made of a metallic container with ground potential, it is designed to be safe from electric shock on the outside but, because of its enclosed structure, internal failure needs to be monitored from the outside.

In FIG. 30, failure signal inside the apparatus is sensed by the sensor 5 installed inside the metallic container and the sensed signal is transmitted through a coaxial cable to a frequency analyzing section (sensing unit) 11 installed near the sensor. The signal analyzed of its frequency by the frequency analyzing section 11 is converted into an optical signal by an E/O converter 61 and then transmitted through optical fiber cable to a monitor unit 60 via an O/E converter 62 installed in a monitor room. The monitor unit 60 specifies the location of occurrence of partial discharge, judges defect type, and evaluates the risk of dielectric breakdown based on the signal information from the multiple sensors.

FIG. 30 shows a gas-insulated apparatus for continuous monitoring, where the sensing unit is installed near the apparatus and the monitor unit is installed in a monitor room. In some cases, the sensing unit and monitoring unit may be integrated into a mobile unit that can be hand-carried, having the same function.

Figure 33:
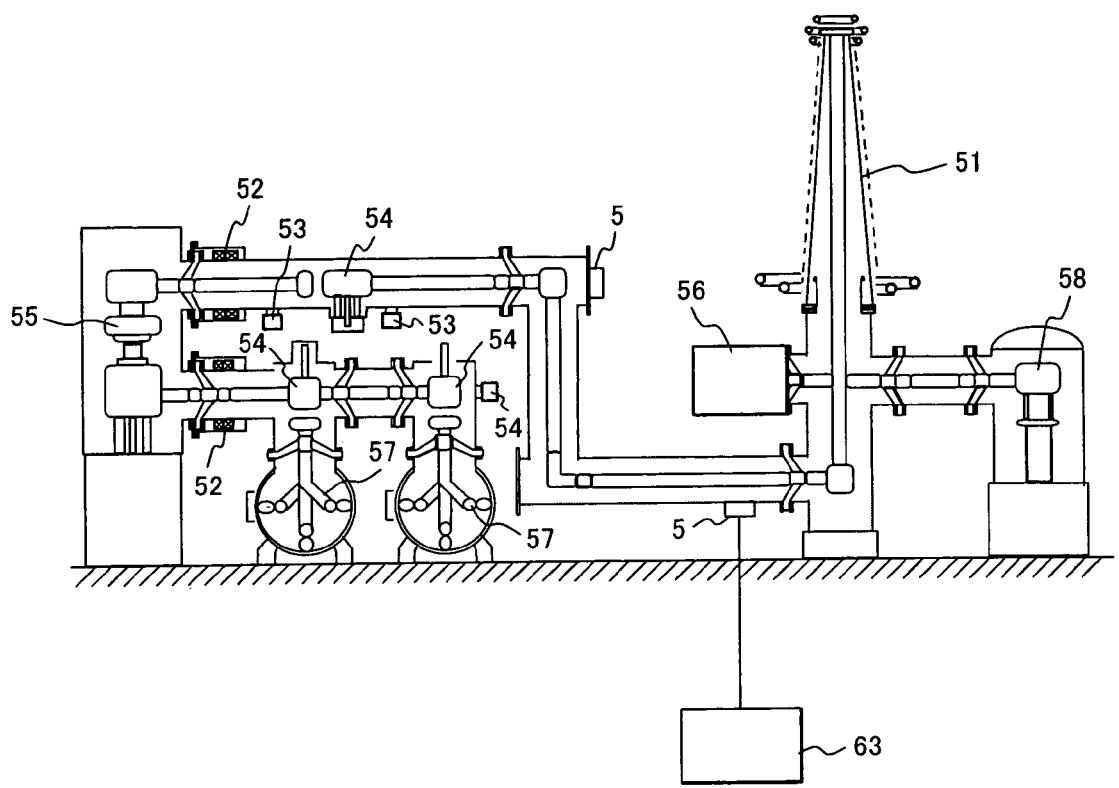
[FIG. 33] Construction of gas-insulated switching apparatus and mobile partial discharge check system

FIG. 33 shows a construction in which a mobile partial discharge check system is used. When a mobile partial discharge check system 63 is employed, cable terminals of the sensors installed inside the gas-insulated apparatus are connected with the mobile unit by coaxial cable so as to measure the signals from the sensors. Instead of installing the sensors inside the gas-insulated apparatus, similar measurement is available by installing sensors for external sensing at electromagnetic signal leaking portions such as spacer and bushing.

Figure 1:
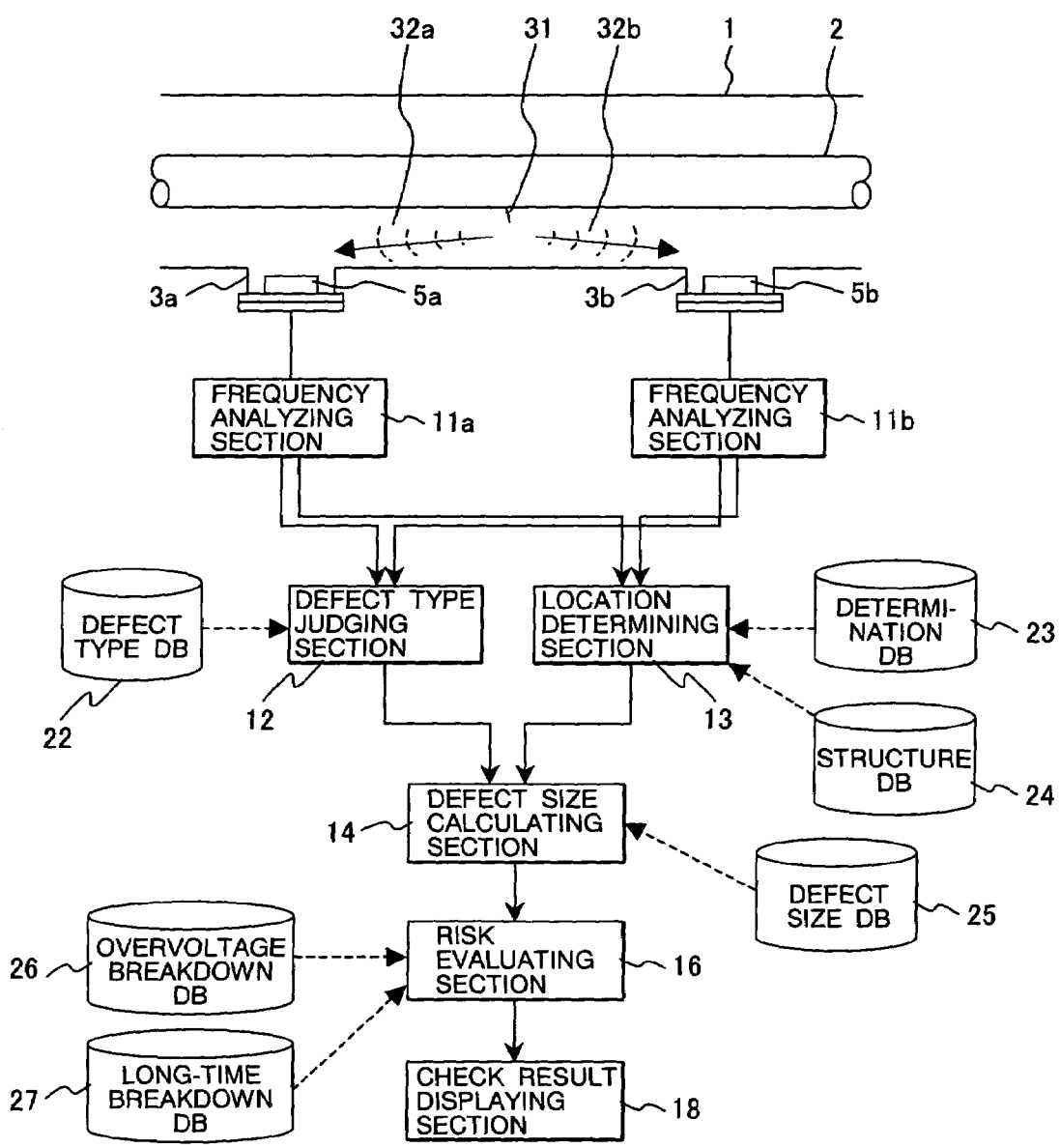
[FIG. 1] Construction diagram of the partial discharge check system of gas-insulated apparatus according to an embodiment of the present invention

FIG. 1 shows a construction where the present invention is applied to the bus of a gas-insulated switching apparatus. The check system of the gas-insulated switching apparatus is equipped with multiple sensors 5 that sense partial discharge signal caused by foreign substance and a frequency analyzing section 11 that analyzes the frequency of the sensed partial discharge signal. It is also equipped with a defect type judging section 12 that judges defect type of the foreign substance based on the analyzed waveform of the frequency analysis or voltage phase distribution of the partial discharge synchronized with the frequency of the voltage applied to the gas-insulated apparatus and a location determining section 13 that estimates defect location and signal intensity based on the partial discharge signals from multiple sensors. It is further equipped with a defect size calculating section 14 that calculates defect size for each estimated defect type based on the signal intensity and field distribution at the defect location of the foreign substance. Each section is described in detail hereunder.

A high-voltage (center) conductor 2 is supported in a cylindrical metallic container (tank) 1 by insulation material such as insulation spacer, and the metallic container 1 is filled with insulation gas such as $SF_6$. FIG. 1 shows a case of "protrusion" where a defect 31 lies on the high-voltage conductor 2, and the partial discharge caused at the tip of the defect 31 emits electromagnetic wave.

In addition to a defect caused by protrusion shown in FIG. 1, there are some other defects such as defect on a spacer surface, free metallic particle moving freely inside the metallic container 1 because of its electrostatic force, void inside the spacer, separation of the spacer from metal electrode or spacer crack, and floating electrode resulting from contact failure of metals such as shield or bolt. Any of these defect types causes partial discharge as the protrusion does and emits electromagnetic wave resulting from the partial discharge. The emitted electromagnetic wave is propagated inside the metallic container and sensed by the sensor 5 installed at a handhole 3 of the metallic container.

Figure 2A:
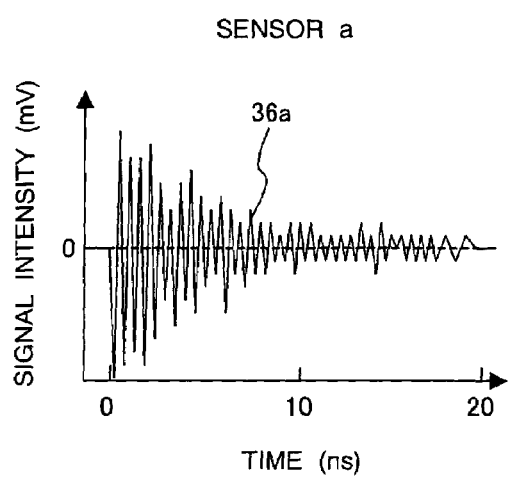
[FIG. 2] Waveform of partial discharge (electromagnetic wave)
Figure 2B:
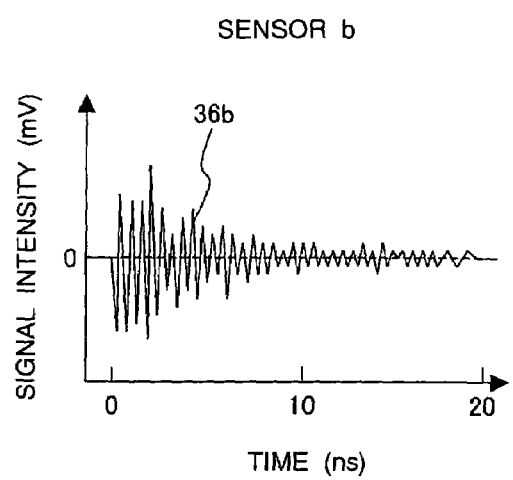

FIG. 2 shows a waveform of the signal sensed by the sensor. FIG. 2(a) is a waveform sensed by the sensor 5a and (b) is a waveform sensed by the sensor 5b. Partial discharge caused in $SF_6$ gas is a pulse current wave having a very sharp rising edge of less than 1 ns (nanosecond) and the electromagnetic signal resulting from it has a high frequency band up to several GHz.

A sensing method utilizing the electromagnetic wave is to sense the signal in the frequency band from several-hundred MHz to several GHz, where big noise signals affecting partial discharge signal sensing, such as broadcasting wave or telecommunication wave mainly used in a frequency band lower than several-hundred MHz, and corona generated below several-hundred MHz can be eliminated from the sensing. The sensor (antenna) 5 has a sensing characteristic capable of sensing the high-frequency signal from the above several-hundred MHz to several GHz, and the signal sensed has the oscillation waveform 36 shown in FIG. 2 (horizontal axis: time, vertical axis: voltage).

The sensed signal is connected to the frequency analyzing section 11 via high-frequency cable such as coaxial cable that transmits high-frequency signal. The frequency analyzing section 11 is designed to be capable of signal intensity analysis by frequency by means of frequency filter or frequency synchronization or super-heterodyne method. The frequency analyzing section 11 does not necessarily uses a hardware frequency analyzing section, but the signal intensity by frequency can be calculated by software means for the Fourier transformation of the partial discharge in FIG. 2.

Figure 3A:
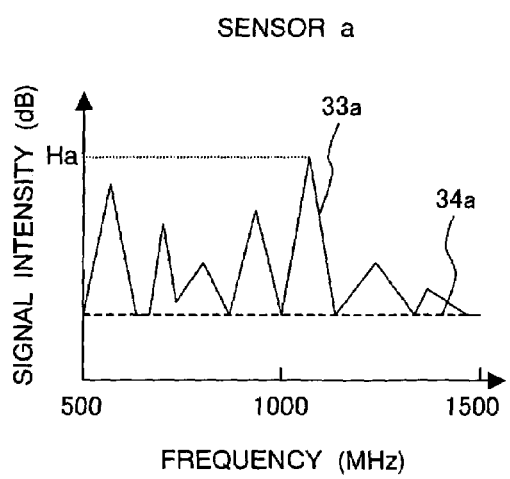
[FIG. 3] Waveform of frequency-analyzed electromagnetic wave of partial discharge
Figure 3B:
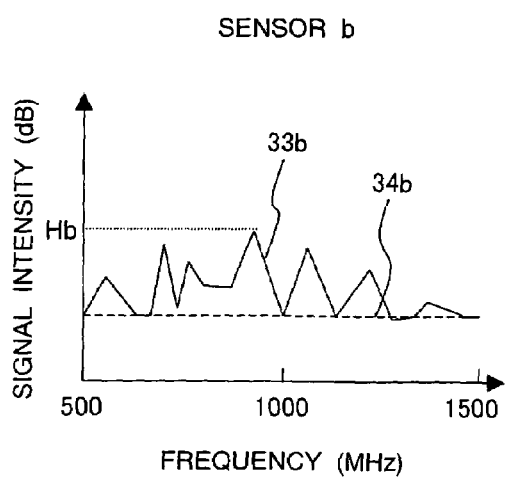

FIG. 3 shows an example of waveform sensed by the frequency analyzing section. FIG. 3(*a*) and (*b*) show the frequency characteristic of the signal intensity in the frequency band from 500 MHz to 1500 MHz, representing the frequency analysis result of the signals in FIG. 2(*a*) and (*b*), respectively. The broken line in FIG. 3 shows the signal output (background noise signal) with no partial discharge signal, and accordingly partial discharge can be thought to have been caused if a signal exceeding this background signal appears.

Although the signal intensity by frequency is calculated by the frequency analyzing section in FIG. 3, a similar result can be obtained by using a signal intensity obtained through a band pass filter such as for 500 MHz to 1500 MHz instead of the signal intensity by frequency. The frequency band of 500 MHz to 1500 MHz referred in this embodiment does not mean to limit the applicable frequency but a frequency band from several MHz to several GHz will do.

Figure 6:
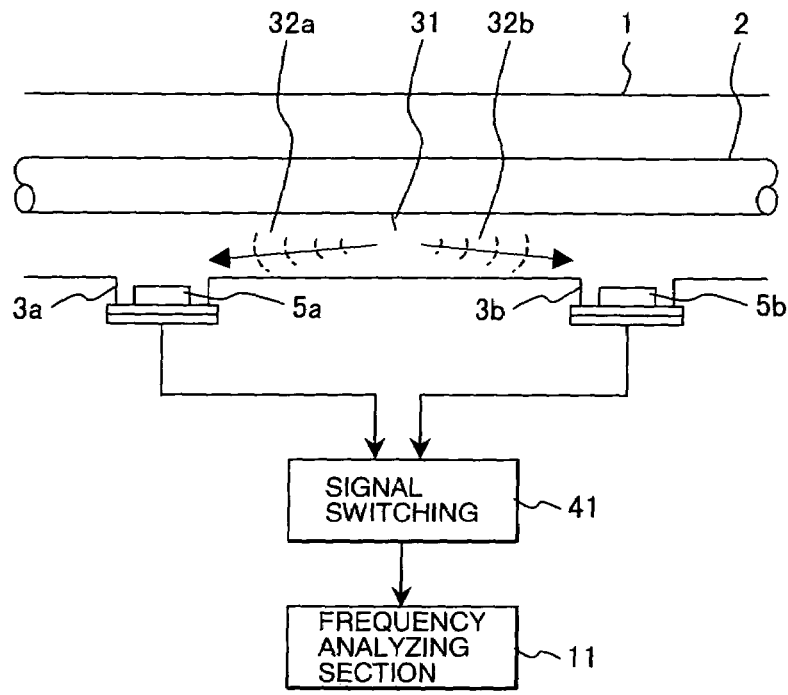
[FIG. 6] Partial construction diagram of a check system employing a signal switch

In addition, although the multiple sensors are provided with respective multiple frequency analyzing sections in FIG. 1, the invention can be realized by using a single frequency analyzing section. FIG. 6 shows a construction using only one frequency analyzing section. With a signal switching section 41 provided as shown therein, frequency analysis can be accomplished by a single frequency analyzing section by switching the signals from multiple sensors.

The defect type judging section 12 in FIG. 1 judges defect type based on the waveform obtained from the frequency analysis by the frequency analyzing section 11 or the voltage phase pattern of the partial discharge synchronized with the frequency of the voltage applied to the gas-insulated apparatus.

For the former, a frequency band of external noises measured beforehand is preset and, if a signal is sensed within the frequency band, it is judged to be noise signal caused outside the gas-insulated apparatus. Occurrence of inner partial discharge can also be confirmed from a fact that partial discharge signal inside the apparatus is caused over multiple frequency bands.

For the latter, the phase pattern representing the intensity of partial discharge depends upon the momentary commercial frequency voltage being applied. For example, signal is generated near the peak of the applied AC voltage in case the defect type is protrusion. Foreign substance caught on a spacer surface results in a phase pattern where the phase is distributed from the zero-cross point through to the peak.

In order to make use of the characteristic pattern of defect type as explained above, phase pattern of each defect type is measured beforehand and registered in the defect type DB 22 as teaching data, and a closest defect type is estimated by a pattern matching technique by comparing the registered data with the measured phase pattern. An estimation technique using neural network can be employed as the pattern matching technique for judging defect type from the sensed signal.

Other available methods of judging defect type include a pattern recognition technique by extracting the characteristic variable of the phase pattern or by using fuzzy system or wavelet conversion.

In the location determining section 13 in FIG. 1, when signals are sensed by two sensors 5*a* and 5*b*, the location of discharge is calculated from the maximum signal intensity in 500 MHz to 1500 MHz, based on the distance and attenuation factor of structure such as spacer. Because the location of occurrence of partial discharge is apart from the sensor 5 for sensing the partial discharge, the signal sensed by the sensor 5 has been attenuated on the way from the location of occurrence of actual partial discharge. Because the inclination (gradient) of the signal attenuation is constant, however, the location of occurrence of the partial discharge and the intensity of the partial discharge at the location can be specified by inversely calculating the signals sensed by the sensor 5.

Figure 4:
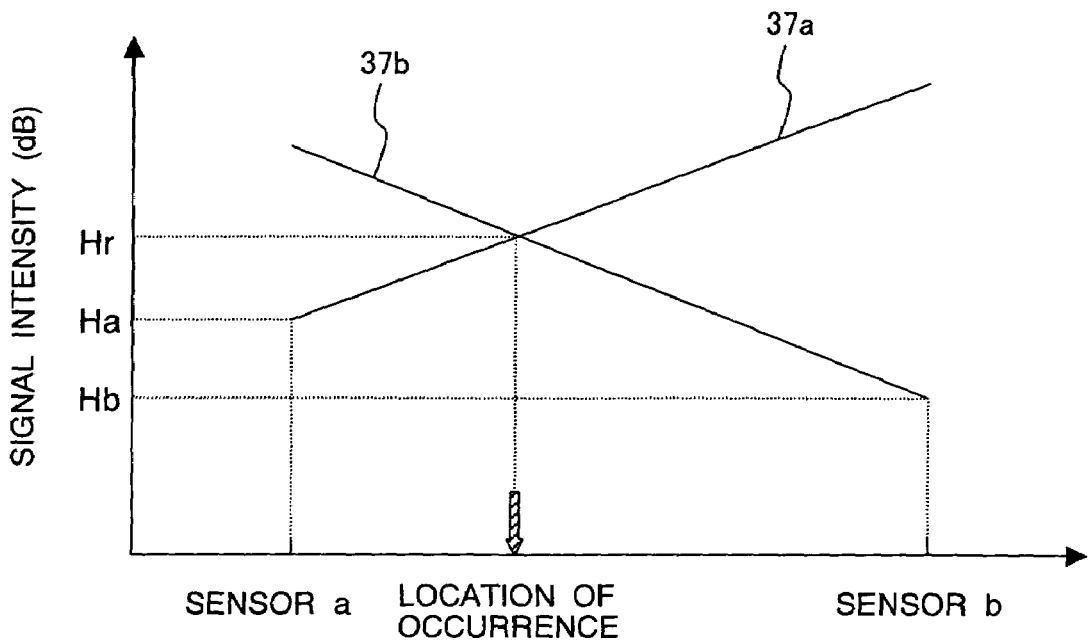
[FIG. 4] Characteristic curve showing the location of occurrence and signal intensity of two sensed partial discharge signals

FIG. 4 shows a mechanism of determining the location of occurrence of partial discharge and the intensity of the partial discharge at the location from the signals of two sensors. The maximum Ha of the signal sensed by the sensor "a" and the maximum Hb of the signal sensed by the sensor "b" are used. When a line is drawn from the signal intensity of Ha measured by the sensor a towards the sensor b, taking the signal attenuation (gradient) into account, and another line is drawn from the sensor b towards the sensor a in a similar manner, taking the signal attenuation (gradient) into account, the intersection of the two lines represents the location of occurrence of signal. In addition, the signal intensity Hr at the intersection representing the location of occurrence shows the signal intensity at the actual discharge location.

In other words, it is not right to regard the signal intensity Ha, Hb sensed by the sensor 5 as the intensity of discharge without correction because the sensed signal attenuates as it propagates inside the metallic container. The actual discharge intensity can be found by obtaining the signal intensity Hr at the determined location of occurrence. A method of determining the location from the difference in arrival time of the signals of two sensors has been proposed.this method is called time flight method. With this method, however, the location of occurrence of discharge can be found but the discharge intensity cannot be obtained. Only after the location is determined from the difference in arrival time, the discharge intensity (signal intensity Hr) can be calculated as shown in FIG. 4 from the determined location and attenuation due to propagation.

Only the signal attenuation due to distance is considered in FIG. 4. However, since each component such as spacer, circuit breaker, disconnecting switch and bus branch exhibits unique signal attenuation, the location of occurrence of partial discharge and its intensity can also be calculated from this signal attenuation.

Figure 5:
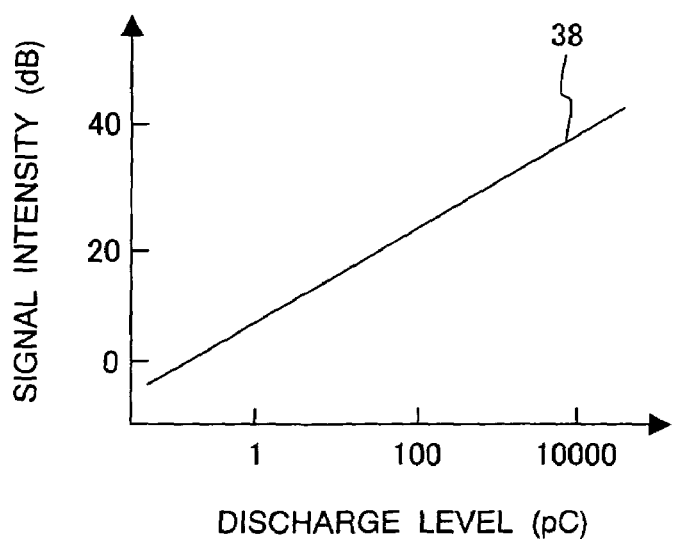
[FIG. 5] Characteristic curve of discharge level vs. signal intensity

FIG. 5 shows the relation between the signal intensity analyzed by the frequency analyzing section and discharge level. The relation between the discharge level Q (pC) and signal intensity X (dB) is expressed by Formula (1), (where C is a constant).

$$X = 20 \log Q + C \qquad (1)$$

Accordingly, either the discharge level (pC) or signal intensity X from the frequency analyzing section 11 can be used as the discharge intensity but, as explained above, the actual signal intensity at the calculated location of occurrence must be used.

Although FIG. 1 shows a case where two sensors 5a and 5b are used, there may be a case where sensors having different sensitivity are used. For example, a sensor installed inside the tank and a sensor for sensing signals leaking from the spacer are utilized. Since each sensor has different sensitivity, the measured signal intensity shall not be used as it is but taking the difference in sensitivity into account is needed.

Next, how to estimate the length of foreign substance by the defect size calculating section in FIG. 1 is described hereunder. The discharge level, i.e. intensity of discharge does not depend on the applied voltage but on the field distribution at the location the defect exists. In other words, even if the discharge level and applied voltage are obtained, the length of defect cannot be estimated unless the field distribution is obtained. Even if it is obtained by estimation, the result is nothing but incorrect length of defect.

Figure 31A:
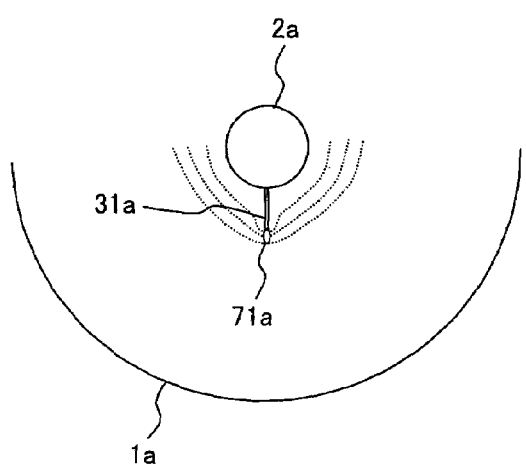
[FIG. 31] Typical diagram showing partial discharge from protrusion
Figure 31B:
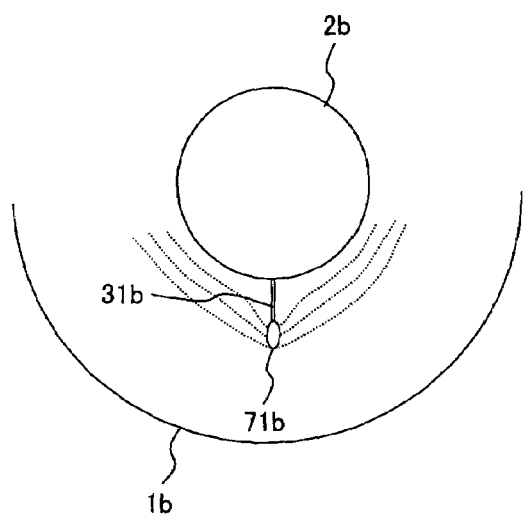

FIG. 31 shows a typical partial discharge and its field distribution generated at a protrusion on a center conductor. FIGS. 31(a) and (b) show a protrusion 31a, b of the same length exist on the center conductor 2a, b of different diameter in a tank of the same diameter, respectively. Broken line shows equipotential contour exhibiting the field distribution and it is understood that the intensity of partial discharge 71a, b differ greatly from each other because the field distribution is different. In other words, since defects 31a, 31b of the same size as shown in the figure can cause totally different intensity of partial discharge (discharge level), an appropriate parameter representing the field distribution must be employed. On the contrary, even if the discharge intensity (discharge level) is known, the defect size cannot be estimated unless the field distribution is obtained.

Based on the above knowledge, the present invention calculated the length of defect (protrusion) from the discharge level, i.e. intensity of discharge and field distribution at the location the defect exists. The defect size calculating section 14 calculates the defect size (scale of defect, length of particle, etc.) based on the defect type obtained by the defect type judging section 12, defect location obtained by the location determining section 13 and intensity of discharge (signal intensity) at the source.

To be concrete, field analysis is performed based on the structural drawing of the location of the foreign substance obtained by the location determination so as to calculate the field strength and unevenness factor. In case this operation is included in a system, the field analysis is performed beforehand and analysis result on each location is stored in a database.

Figure 7:
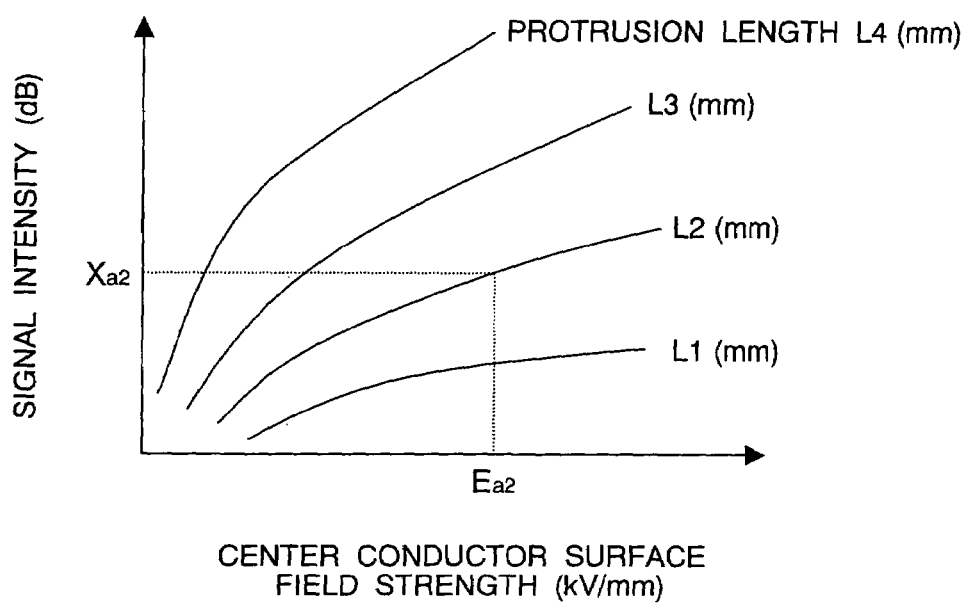
[FIG. 7] Characteristic curve of conductor surface field strength vs. signal intensity in case of different protrusion length

FIG. 7 shows the relation between the center conductor surface field strength and signal intensity in case the length of defect (protrusion length) is different, where the field unevenness factor is constant. While the center conductor surface field strength represents the field strength at the location the protrusion exists, it represents the field strength on the tank bottom in case the protrusion exists on the tank side. Since the field unevenness factor is assumed to be constant here, the protrusion length can be estimated if the field strength at the location of the protrusion and signal intensity (discharge level) of the partial discharge are obtained. For example, given that the center conductor surface field strength is Ea2 and signal intensity is Xa2, the protrusion length can be estimated to be L2.

However, since the field unevenness factor at the location of protrusion is assumed to be constant in FIG. 7, the protrusion length becomes different if the field unevenness factor is different. The field unevenness factor, a product of the maximum field at the location divided by average field, is expressed by Formula (2) and the field unevenness factor becomes greater at a location with more complicated shape.

$$\text{Field unevenness factor} = \text{Maximum field}/\text{Average field} \qquad (2)$$

Figure 8:
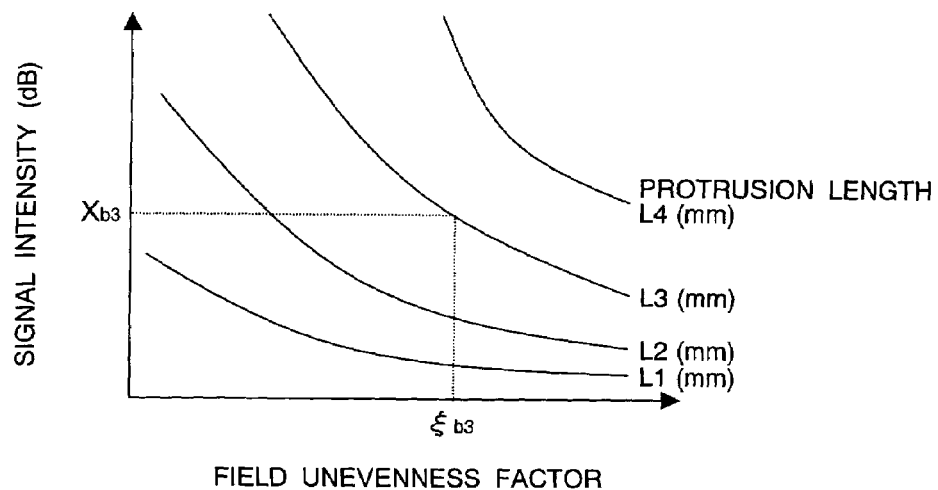
[FIG. 8] Characteristic curve of field unevenness factor vs. signal intensity in case of different protrusion length

FIG. 8 shows the relation between the field unevenness factor and signal intensity in case the field strength is constant and the length of foreign substance is different. As understood from the figure, if the field strength at the location of the protrusion is constant, the protrusion length can be estimated from the relation between the field unevenness factor and field intensity. In short, given that the field unevenness factor is $\xi b3$ and signal intensity is Xb3, the protrusion length can be estimated to be L3.

However, since the field unevenness factor is assumed to be constant in FIG. 7 and the conductor surface field strength is assumed to be constant in FIG. 8, the protrusion length cannot be estimated unless both conductor surface field strength and field unevenness factor are obtained in reality.

Figure 9:
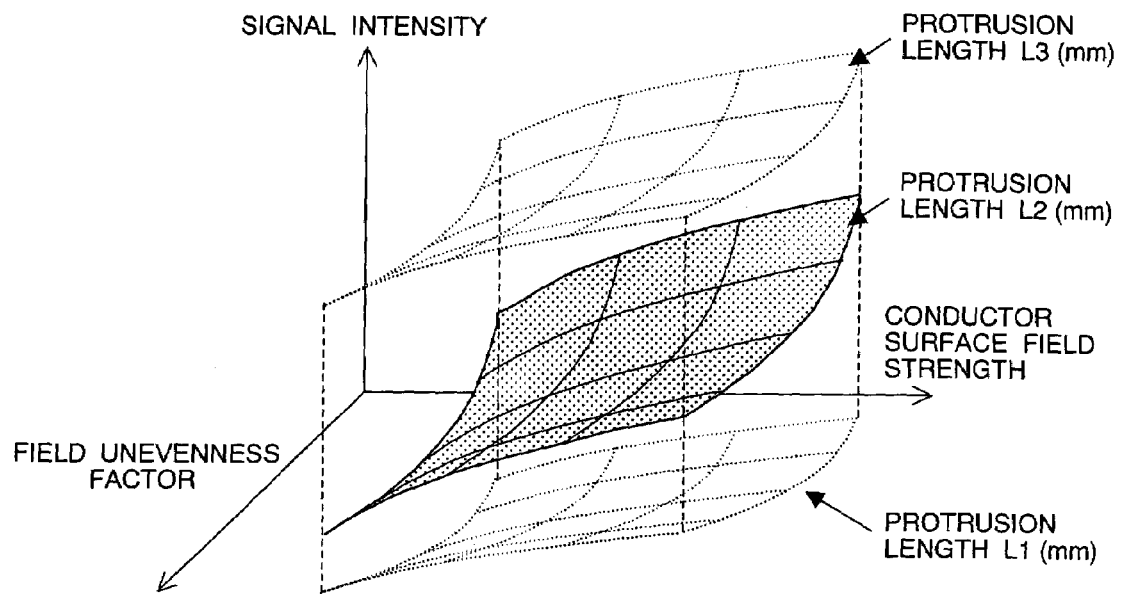
[FIG. 9] Characteristic curve of conductor surface field strength—field unevenness factor—signal intensity in case of different protrusion length

FIG. 9 shows the correlation between the conductor surface field strength, field unevenness factor and signal intensity in case of different protrusion length. Each curve in the figure shows the characteristic corresponding to each protrusion length L1, L2, and L3. Since the signal intensity at the discharge source, and conductor surface field strength and field unevenness factor at the location of the protrusion can be obtained by making use of this characteristic, the protrusion length can be estimated.

Figure 10:
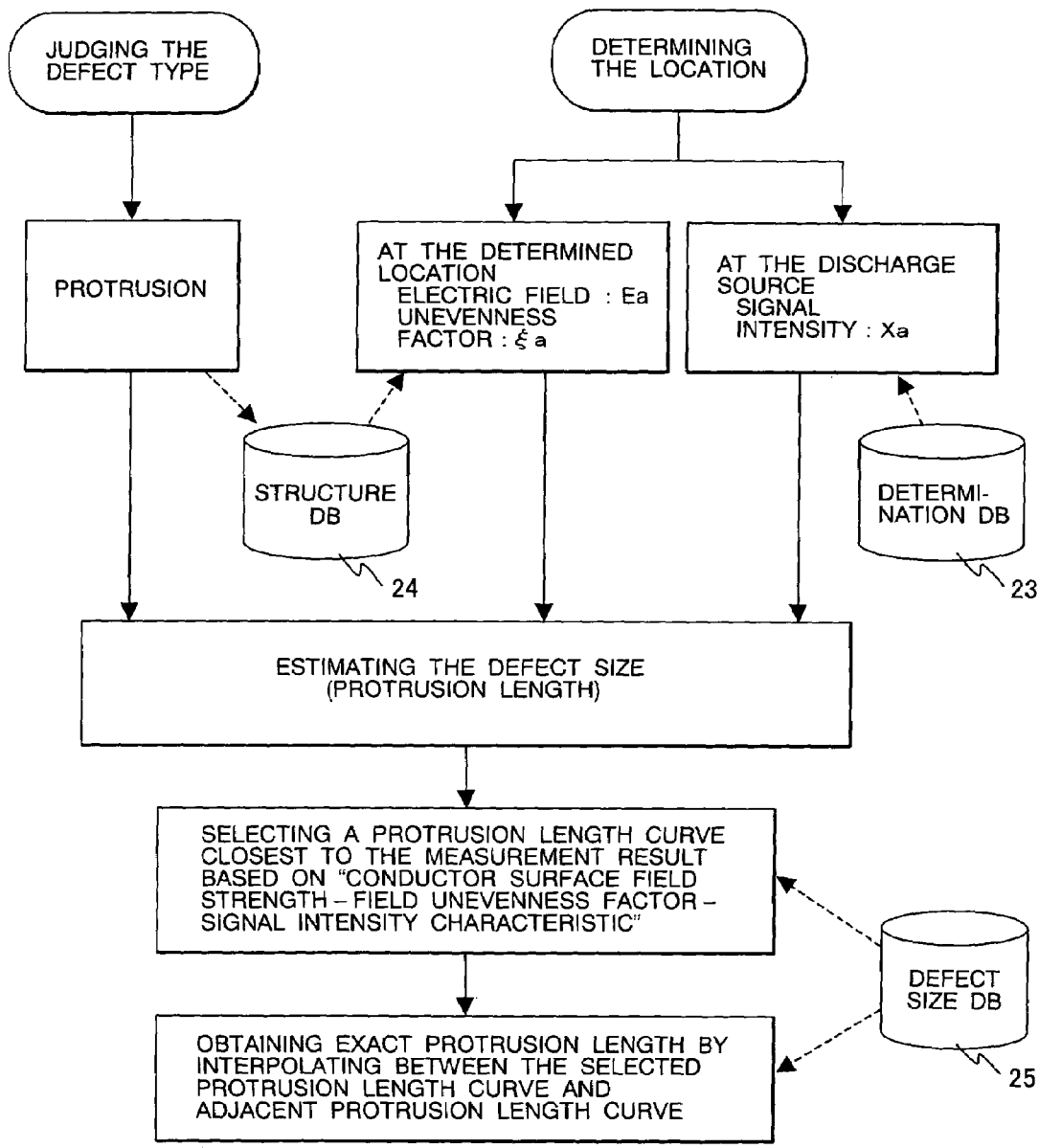
[FIG. 10] Flowchart for estimating defect size

FIG. 10 is a flowchart showing the sequence of estimating the defect size in case the defect type is protrusion. This is a flow where the judgment result at the defect type judging section is protrusion. When the defect is judged to be protrusion, the conductor surface field strength E and field unevenness factor $\xi$ at the determined location are read out from the structure database (structure DB) 24 for protrusion.

Figure 11:
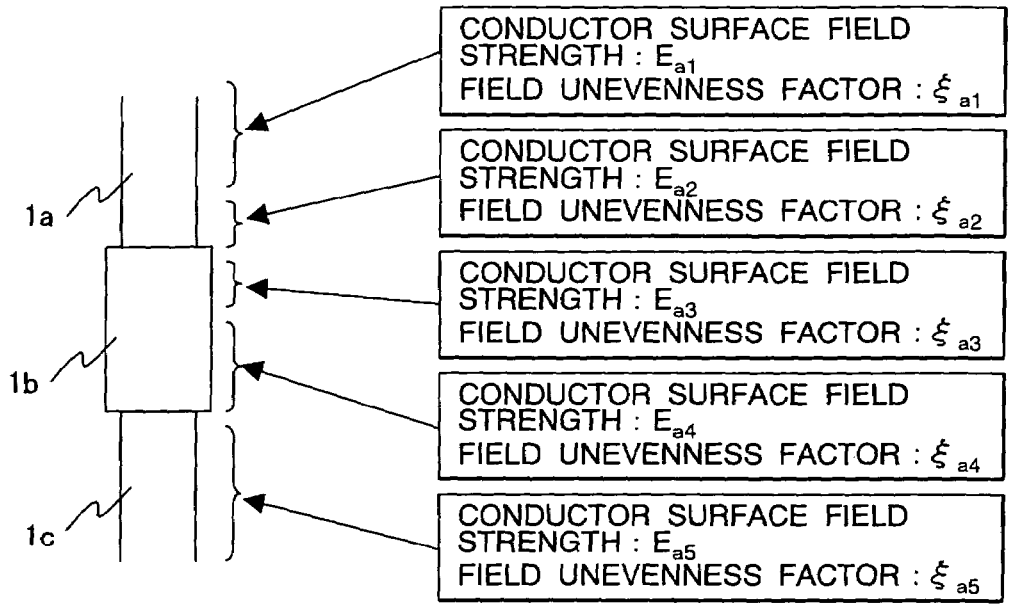
[FIG. 11] Structural diagram of structure database in case of protrusion

FIG. 11 shows the data composition of the structure DB. The figure shows an example of the disconnecting switch in a gas-insulated switchgear, where a portion 1b having a larger tank diameter is the disconnecting switch and portions 1a, 1c on both sides are the bus. Since the conductor surface field strength data Ea and field unevenness factor data $\xi a$ at each location are stored in the structure DB 24, necessary conductor surface field strength and field unevenness factor can be read out based on the result of the location determination.

Figure 12:
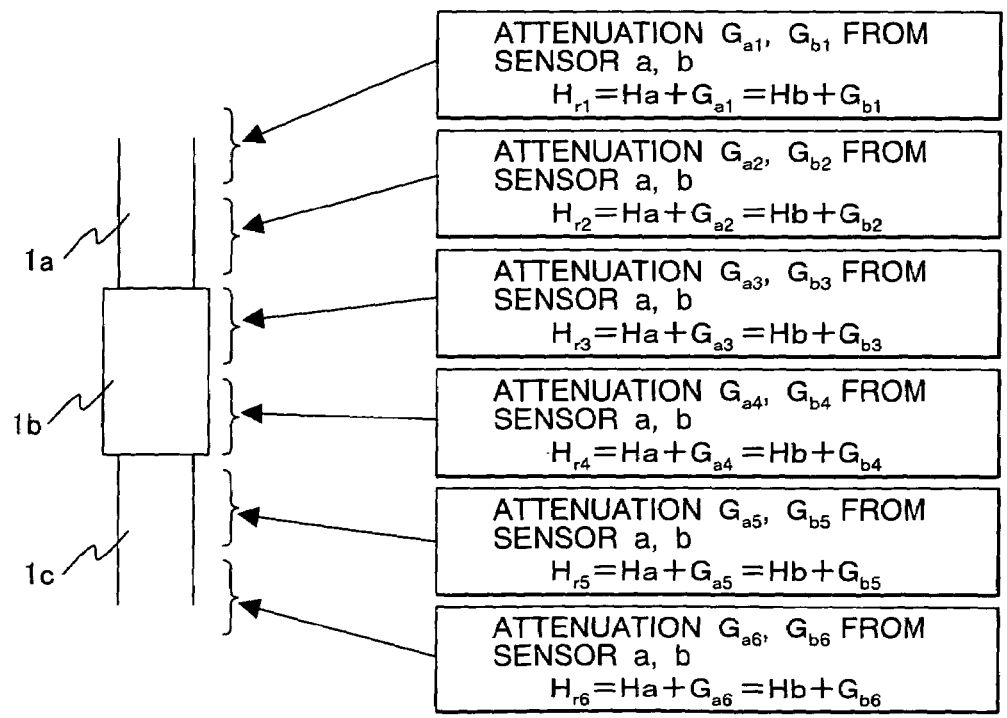
[FIG. 12] Structural diagram of location determination database in case of protrusion

FIG. 12 shows the data composition of the determination DB. The signal intensity at the discharge source can be calculated from the determination DB 23. When the location is determined, the signal intensity (Hr1) of the partial discharge at the location can be obtained based on the attenuation from the sensor at each location (for example, attenuation Ga1 from the sensor a) stored in the determination DB 23.

The defect size is then estimated from the protrusion as defect type, conductor surface field strength and field unevenness factor at the determined location and signal intensity of the partial discharge, each of which has been obtained as described above. In practice, although the conductor surface field strength and field unevenness factor cannot be obtained univocally from the determined location, those leading to the greatest defect size are employed out of the ones available at the determined location since the defect size is to be estimated on a safe side (a side with higher risk).

To be concrete, each measurement point showing the measured signal intensity, field strength at the estimated location of the defect, and field unevenness factor is plotted in the conductor surface field strength—field unevenness factor—field strength characteristic curve (FIG. 9) as shown in the flowchart in FIG. 10. If the plotted measurement point is positioned on a curve of existing protrusion length (protrusion length curve), the result can be regarded as the protrusion length that corresponds the protrusion length curve. If the plotted point is not positioned on an existing protrusion-length curve, one each curve of existing protrusion length (protrusion length curve) just above and below the measurement point is selected and the plotted measurement point is interpolated (for example, by linear interpolation) between the two selected protrusion length curves so as to estimate a new protrusion length curve on which the measurement point can exist. Thus, the protrusion length can be deduced exactly.

Figure 13:
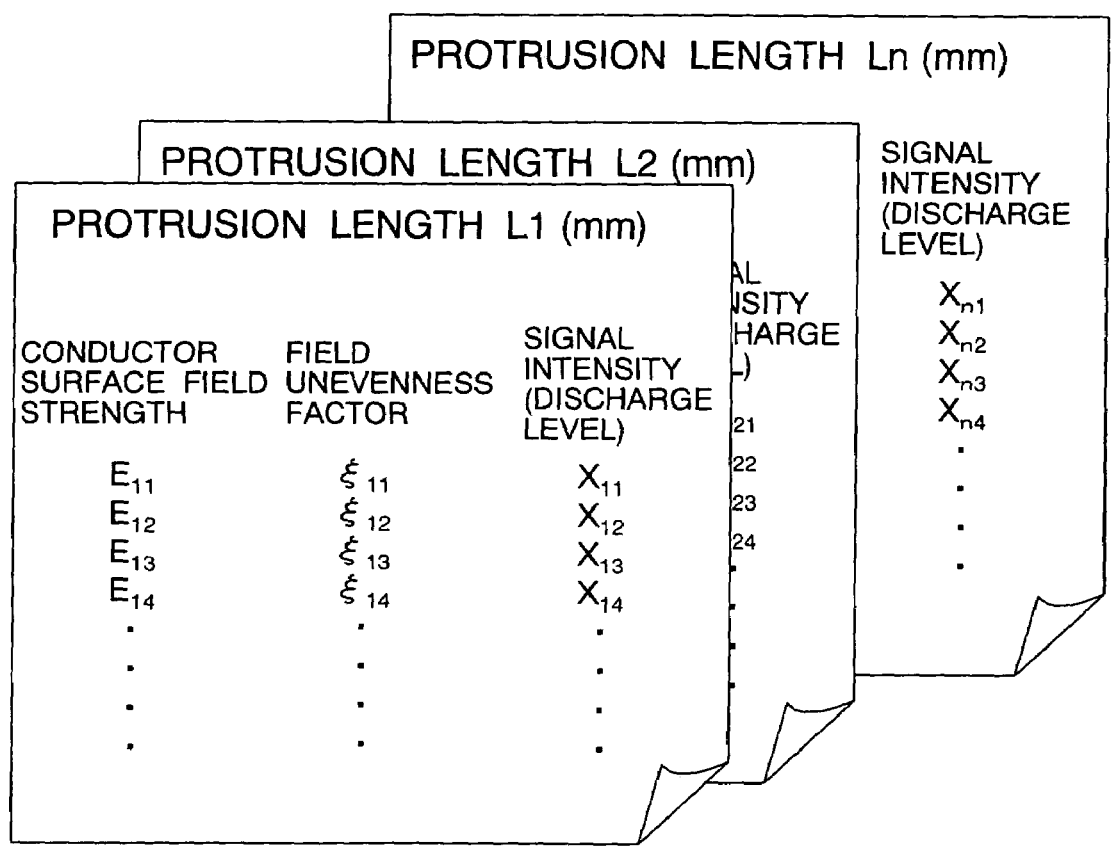
[FIG. 13] Structural diagram of defect size database in case of protrusion

The defect size database is a database of the characteristic shown in FIG. 9 (defect size DB 25), and FIG. 13 shows the database composition. That is, a piece of numeric data on the conductor surface field strength E—field unevenness factor ξ—signal intensity X is stored for on defect length L and the curve in FIG. 9 is generated based on this data. It becomes possible to obtain the defect length more efficiently by utilizing the defect size DB 25 like the above.

According to this embodiment, in monitoring the failure condition of a gas-insulated apparatus by sensing partial discharge signal caused by foreign substance in the gas-insulated apparatus, it becomes possible as described above to estimate the defect size based on the signal intensity of the sensed partial discharge signal, and field strength and field unevenness factor at the defect location deduced from the structural dimension of the gas-insulated apparatus.

Figure 29:
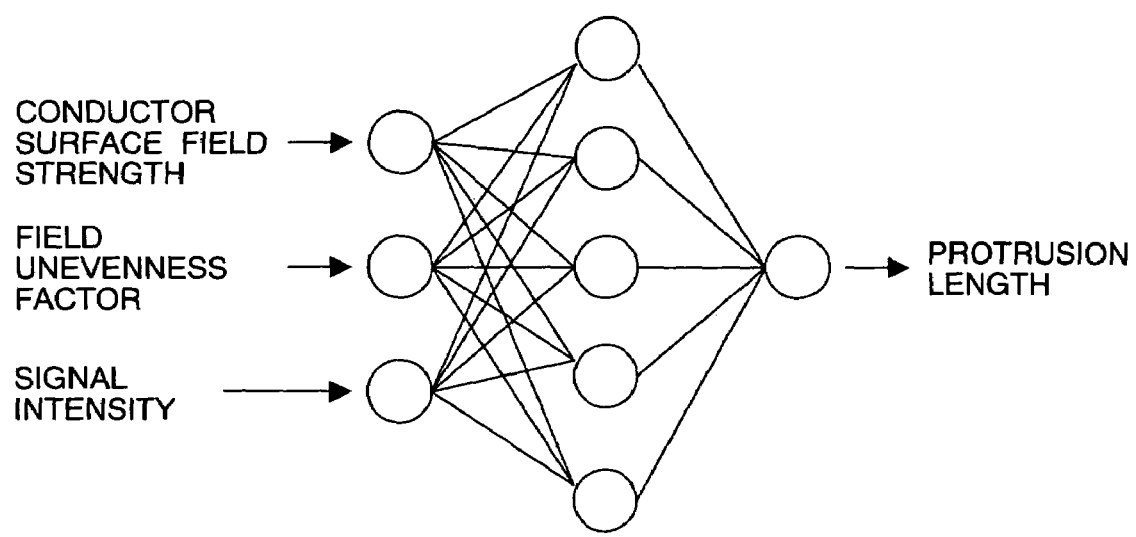
[FIG. 29] Typical diagram for estimating the protrusion length by using neural network

It is also possible to estimate the protrusion length by letting a neural network learn the defect size database 25 shown in FIG. 9. FIG. 29 shows a way of calculating the protrusion length in a neural network. By inputting the conductor surface field strength E, field unevenness factor ξ and signal intensity X into the input layer and defining the output layer as the protrusion length L, the protrusion length can be led out from the output layer without performing the above interpolation.

When the protrusion length is calculated by the defect size calculating section 14, breakdown potential is calculated by the risk evaluating section 16. In evaluating a risk, what risk exists in the operating voltage and what risk is caused in case of incoming overvoltage are evaluated. Overvoltage includes disconnecting switch surge, lightning surge, switching surge, short-time overvoltage upon one-line ground, and residual DC voltage upon disconnecting switch operation.

Figure 14:
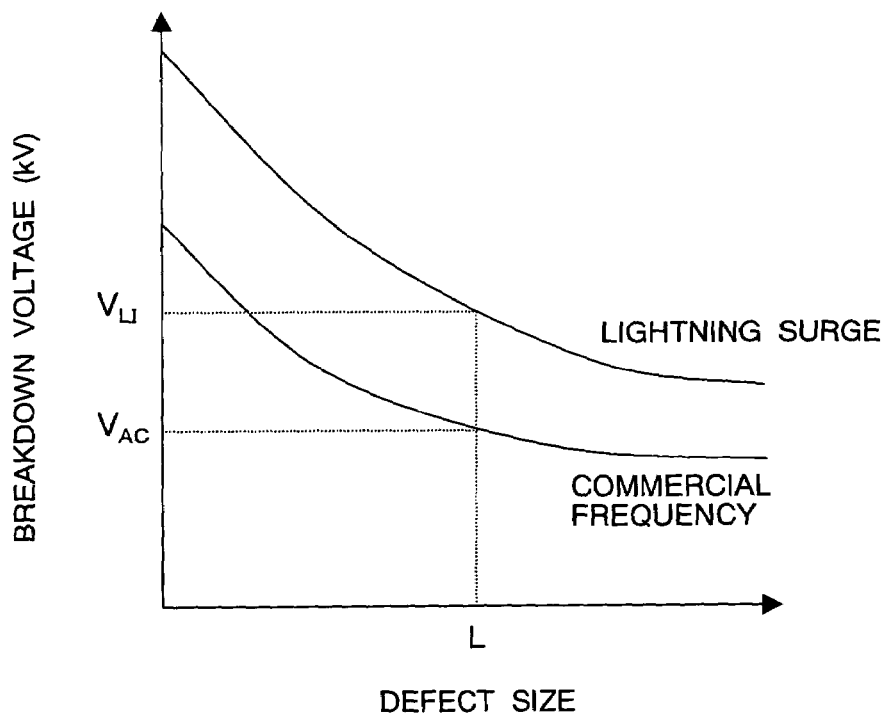
[FIG. 14] Characteristic curve of breakdown voltage in case of defect size being lightning surge and AC overvoltage

FIG. 14 shows the breakdown voltage characteristic in case of lightning surge and commercial frequency. When the estimated protrusion length is L, the breakdown voltage due to lightning surge is VLI and breakdown voltage due to commercial frequency is VAC. Probability can also be estimated as to at what percentage of the breakdown voltage the present operating voltage (for example, voltage to ground at 318 kV for 550 kVGIS) is positioned, or what percentage of risk exists at the maximum short-time overvoltage (476 kV (=318 kV×1.5 times) for 550 kVGIS) upon one-line ground.

With regard to lightning surge, whether the breakdown voltage VLI is exceeded upon incoming lightning impulse withstand voltage (LIWV) (1425 kV for 550 kVGIS) or, even if not exceeded, at what percentage of the breakdown voltage it is positioned can be calculated.

Figure 15:
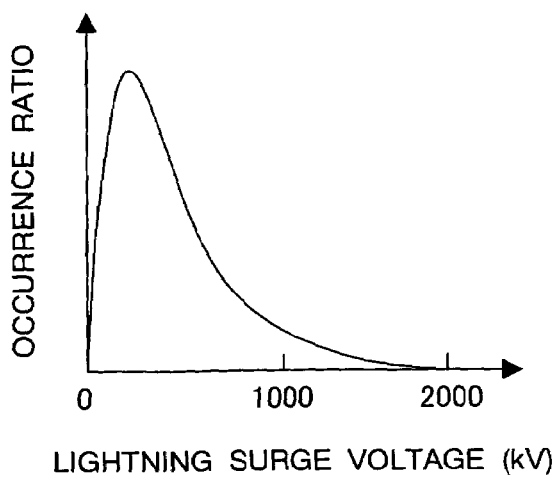
[FIG. 15] Distribution diagram of occurrence ratio of voltage by lightning surge
Figure 16:
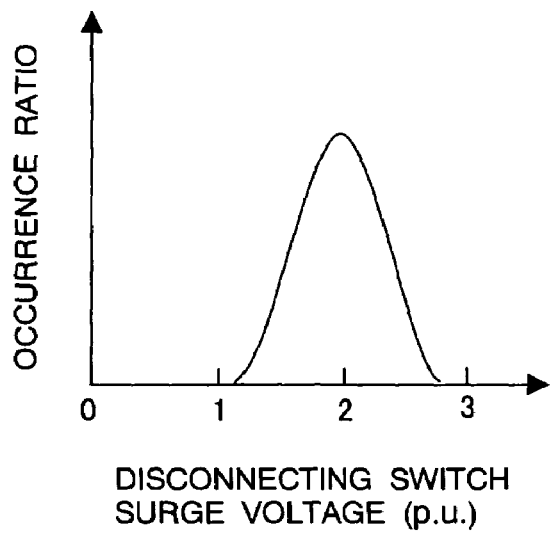
[FIG. 16] Distribution diagram of occurrence ratio of voltage by disconnecting switch surge

Instead of evaluating the risk potential in percentage of the breakdown voltage, it can be calculated in probability by utilizing the ratio distribution of overvoltage to occur. FIG. 15 shows the occurrence ratio of lightning surge and FIG. 16 shows the occurrence ratio disconnecting switch surge.

If the frequency of lightning at a substation in question and number of times of disconnecting switch operation of the gas-insulated apparatus in question are known, probability of the breakdown potential can be calculated by summing up the occurrence ratio. If the number of lightning occurred is 10 times/year at a 550 kV substation and the lightning surge voltage of L (mm) calculated by the defect size calculating section is VLI (kV), the occurrence ratio of lightning in excess of VLI (kV) can be calculated as 0.1% in FIG. 15. Consequently, the breakdown potential within a year is 1%. A sum of the breakdown potential of each overvoltage like the above is calculated as the breakdown potential due to overvoltage.

Figure 17:
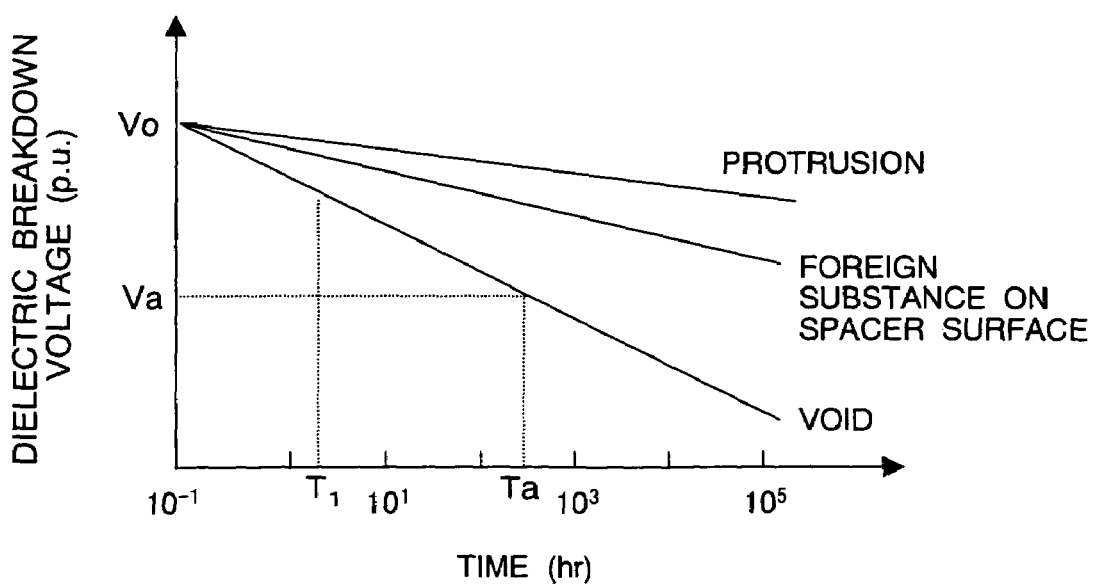
[FIG. 17] Characteristic curve of dielectric breakdown voltage when applied for long time in case of each defect type

On the other hand, in evaluating the risk of breakdown under the operating voltage, operating time is important in addition to the operating voltage. FIG. 17 shows the breakdown voltage—operating time (long time V-t) characteristic in case of long time operation. Each curve represents different defect type, that is, void, particle on spacer surface and protrusion, and the breakdown voltage at the applied time (operating time) of zero is standardized as VO. Curves in the figure are expressed by Formula (3).

$$V = VO \times t^{-1/n} \qquad (3)$$

where VO is the breakdown voltage with t=0, n is a constant specific to each defect type: 6 to 8 for void, 20 to 50 for particle on spacer surface, and 50 to 150 for protrusion. In estimating the breakdown potential in case the defect type is void and the operating voltage is Va for example, given that the breakdown potential is the ratio of breakdown voltage to operating voltage, the breakdown potential with t=0 is calculated as Va/VO and that with t=t1 is calculated as Va/(VO×t1$^{-1/n}$). The time before breakdown can also be estimated by utilizing FIG. 17, that is, in case the defect type is void and the operating voltage is Va, breakdown can be predicted to occur in the time Ta after the start of operation.

In case the defect type is void or particle caught on spacer surface, it sometimes happen that the phase pattern varies as the time elapse. In other words, the risk can be evaluated to more definite criterion by obtaining both the increase of the breakdown potential in the long-time V-t characteristic shown in FIG. 17 and the variation of the phase pattern.

Figure 18:
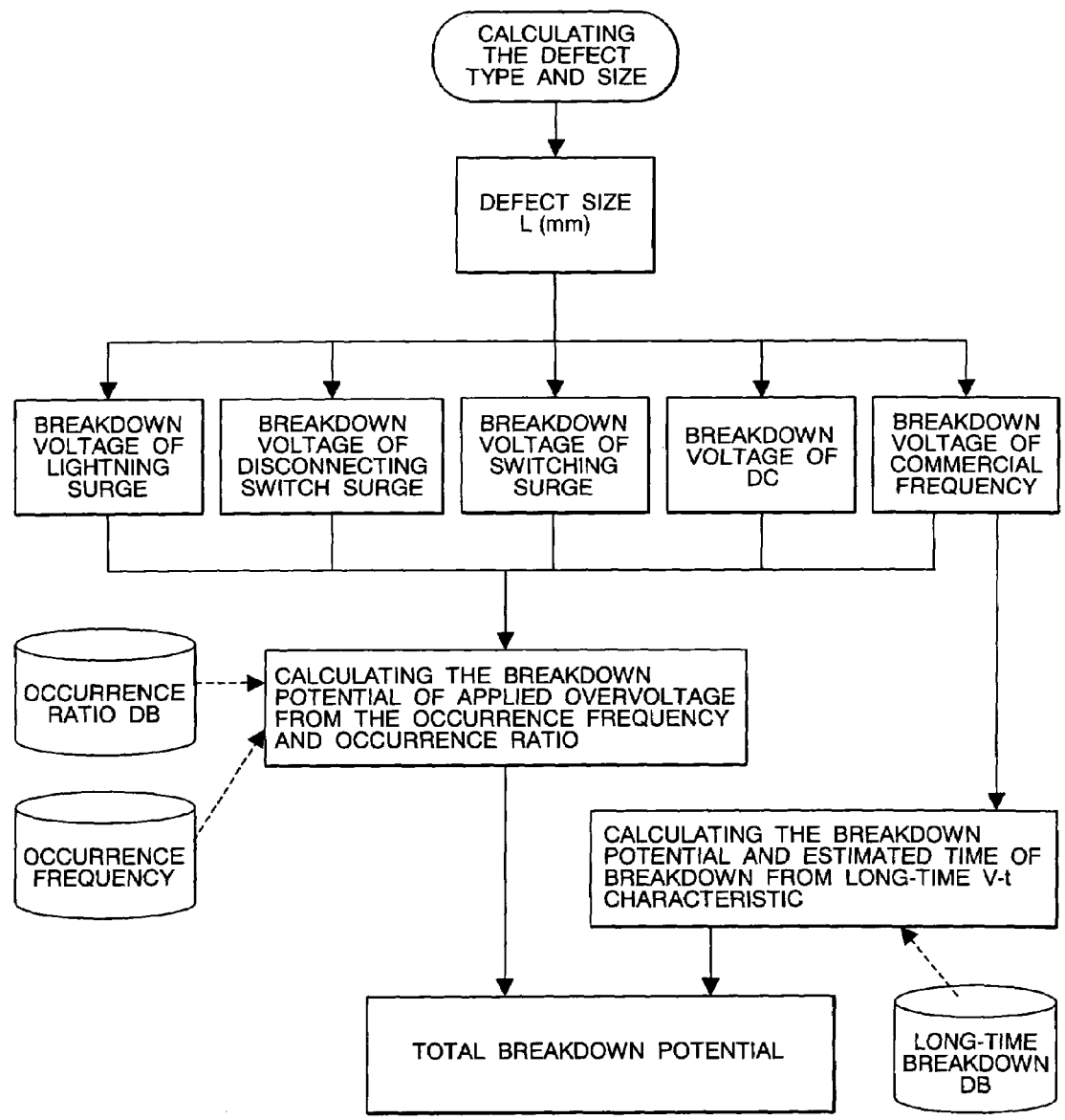
[FIG. 18] Flowchart for calculating breakdown potential

FIG. 18 is a flowchart of evaluating the breakdown potential by the risk evaluating section. That is to say, the breakdown potential (breakdown probability) upon incoming overvoltage is calculated according to defect type and also the breakdown potential (breakdown probability) under the commercial-frequency operating voltage is calculated in terms of operating time, and then the total breakdown potential (breakdown probability) is obtained by summing up the above.

By calculating the breakdown potential as above, it becomes possible to specify a preset value for the risk evaluation and to base the operation on it. Provided that the value is set to 10% of the total breakdown potential per year for example, it is not necessary to cease the operation for inspection and repair until the breakdown potential exceeds the set value even if partial discharge is observed, Hence, effective maintenance can be carried out. In addition, this set value becomes effective if it is so set to an optimum value that the amount of damages incurred in case of accident should not exceeds the total of maintenance cost and operating cost.

The check result displaying section 18 in FIG. 1 displays the risk (risk level) and maintenance guidance based on the breakdown potential obtained from the risk evaluating section 16. FIG. 19 shows an example of display. In this example, the risk level and maintenance guidance as well as the defect type, defect location and discharge level are displayed. The risk level is rated at 3 of 5-level rating and guidance on the necessity of inspection within a month and continuation of trend monitoring is given.

FIG. 20 shows example guidance in case of risk. Guidance is given in each risk of 5-level rating, and the gas-insulated apparatus can be maintained according to this guidance.

With the partial discharge check system of the present invention, condition of the gas-insulated apparatus upon insulation failure can be checked exactly and necessary guidance on maintenance can be provided based on the obtained risk level.

Embodiment 2

A case where the defect type is protrusion has been described in Embodiment 1. Next, another defect size calculation in case of different defect type is described hereunder.

Typical defect type in a gas-insulated apparatus is defect caught on spacer surface. This is a case where some mixed metallic particle is caught on the spacer for supporting the center conductor in FIG. 30.

Figure 32:
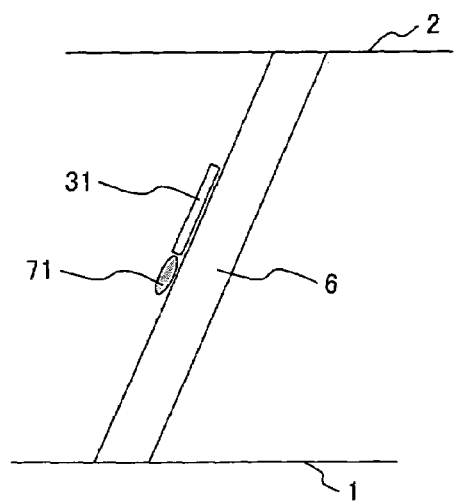
[FIG. 32] Typical diagram showing partial discharge from foreign substance caught on the spacer surface

FIG. 32 shows an example particle caught on the surface of the spacer. In case a particle 31 is caught on the surface of the spacer 6, the electromagnetic wave of the caused partial discharge 71 is sensed by the sensor installed inside the gas-insulated apparatus. As shown there, partial discharge 71 is caused at the end of the particle 31 on the surface of the spacer 6.

The partial discharge 71 caused progresses along the spacer surface. That is to say, in evaluating the signal intensity (discharge level) of the partial discharge 71 from the foreign substance 31 caught on the spacer surface, the field distribution along the spacer surface must be taken into account.

Figure 21:
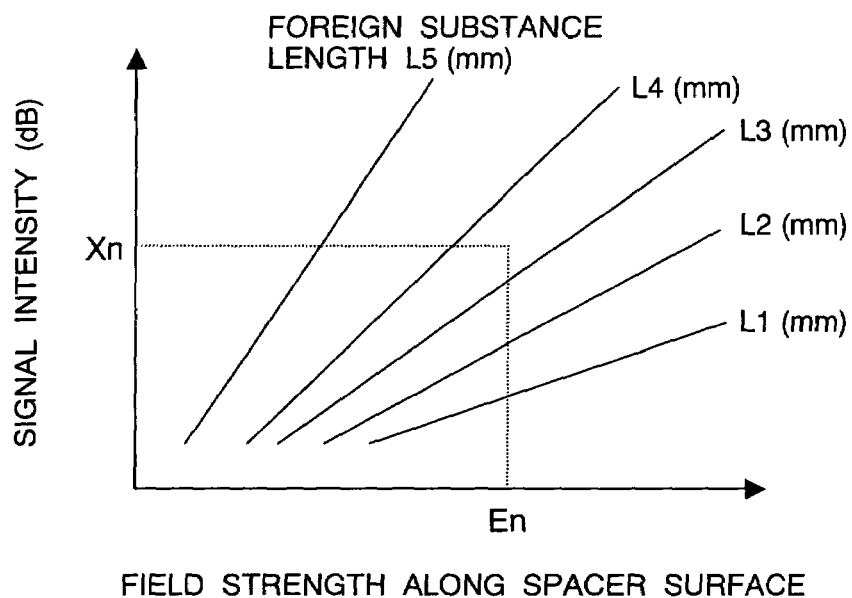
[FIG. 21] Characteristic curve of spacer surface field vs. signal intensity in case the length of foreign substance caught on the spacer surface is varied

FIG. 21 shows the characteristic of spacer surface field component vs. signal intensity in case the length of the particle caught on the spacer surface is varied. For the particle 31 caught on the spacer surface, the relation between field along the spacer surface and signal intensity is defined as shown in the figure. Accordingly, from the maximum surface field En of the spacer and signal intensity Xn of the partial discharge, the length of the particle can be estimated to be between L3 and L4. After the particle length is estimated, breakdown potential is calculated in the same manner as in Embodiment 1.

FIG. 23 shows an example of the structure DB. By storing the maximum surface field strength data corresponding to each spacer 4a to 4d of the gas-insulated apparatus in the structure DB 24 as shown in the figure, smooth size evaluation becomes possible.

Figure 22:
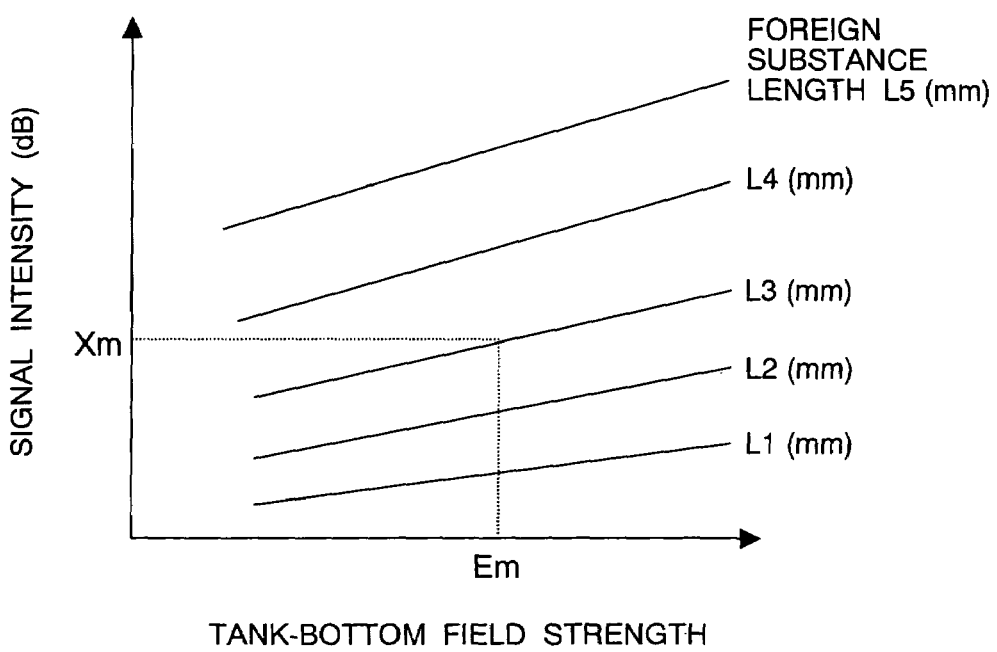
[FIG. 22] Characteristic curve of tank-bottom field strength vs. signal intensity in case of free foreign substance of different length

FIG. 22 shows the characteristic of tank-bottom field strength vs. signal intensity in case of free metallic particle. There are defect (free metallic particle) that move freely inside the tank by electrostatic force. In case of free metallic particle, the particle length is determined from the relation between the tank bottom field and signal intensity. Where the tank-bottom field is Em and signal intensity of partial discharge is Xm as shown in FIG. 22, the particle length can be estimated to be L3.

In case of other defect than the above, it is not always necessary to estimate the defect size FIG. 24 shows the partial discharge characteristic of other defect types and maintenance guidance. Since these defects are apt to cause deterioration, continuous monitoring or periodic monitoring is needed in most cases is any is sensed.

Embodiment 3

In estimating the defect size in Embodiment 1 and Embodiment 2, the frequency of the sensed signal is analyzed to obtain the maximum signal intensity (FIG. 3) in the frequency band from 500 MHz to 1500 MHz and the actual discharge intensity is calculated from it. This, however, does not consider the frequency sensed in the frequency band from 500 MHz to 1500 MHz. Since the rising time of partial discharge is very sharp such as in ns (nanosecond) as explained previously, it contains signal components reaching the high-frequency band.

Figure 25:
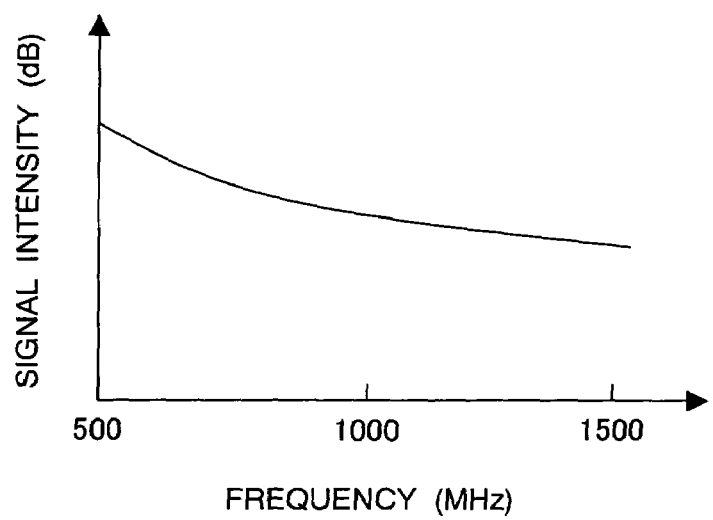
[FIG. 25] Characteristic curve of frequency of partial discharge pulse

FIG. 25 shows the frequency characteristic of partial discharge signal. The frequency characteristic in 500 MHz to 1500 MHz exhibits higher signal intensity at lower frequency. This curve can be expressed by Formula (4) in terms of the frequency f, (where C is a constant).

$$y = -20 \times \log(f) + C \qquad (4)$$

In other words, same discharge results in different signal intensity depending upon the frequency band and, therefore, the frequency to be sensed must also be taken into account in order to accomplish highly accurate check. In consideration of the frequency band to be applied, for example, the signal intensity of discharge is calculated by converting it into the signal intensity at 500 MHz.

Figure 26:
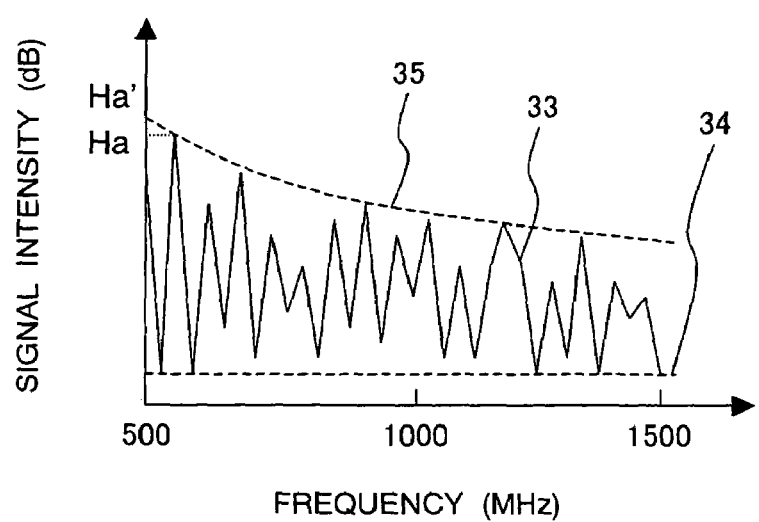
[FIG. 26] Typical diagram for converting signal intensity from the measured frequency characteristic
Figure 27:
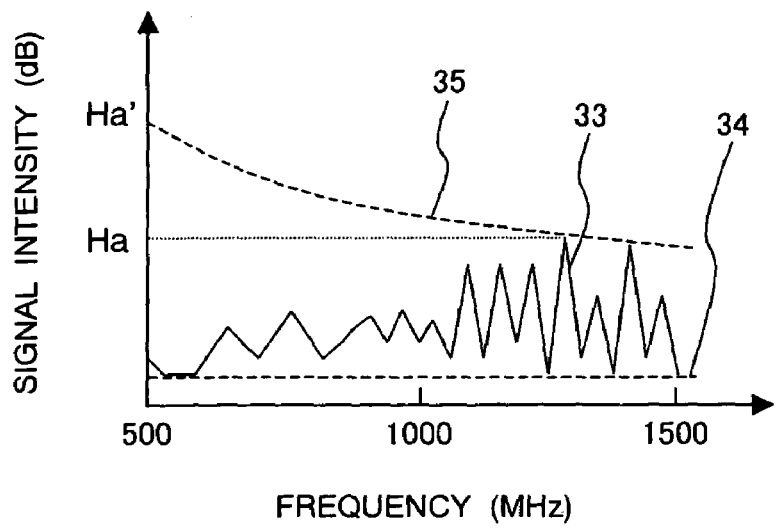
[FIG. 27] Another typical diagram for converting signal intensity from the measured frequency characteristic

Each FIG. 26 and FIG. 27 shows the conversion of the frequency-analyzed waveform and dotted line represents the frequency characteristic 35. In the case in FIG. 26, since signal is sensed throughout the band from 500 MHz to 1500 MHz, the peak Ha in 500 MHz to 1500 MHz does not greatly differ from the value Ha' converted at 500 MHz.

In the case in FIG. 27, on the contrary, signals in lower frequency band are smaller than those in higher frequency band and so Ha greatly differs from Ha'. Accordingly, Ha' must be converted before use for accurate check. This is because, when the electromagnetic wave propagates inside a metallic container, signals in lower frequency band attenuates more quickly than the attenuation in normal propagation due to the structure of internal components and metallic container. However, since the propagation is thought to be normal in higher frequency band, the peak in high-frequency band can be utilized for highly accurate check by converting it into the signal intensity at 500 MHz. Although the above explanation refers to the frequency of 500 MHz as reference, the reference frequency shall not necessarily be 500 MHz.

In case any noise signal exists, it becomes necessary that the frequency band of noise occurred is measured beforehand and that the frequency band is excluded from sensing or, if included, sensed data is excluded from consideration by a software means.

Figure 28:
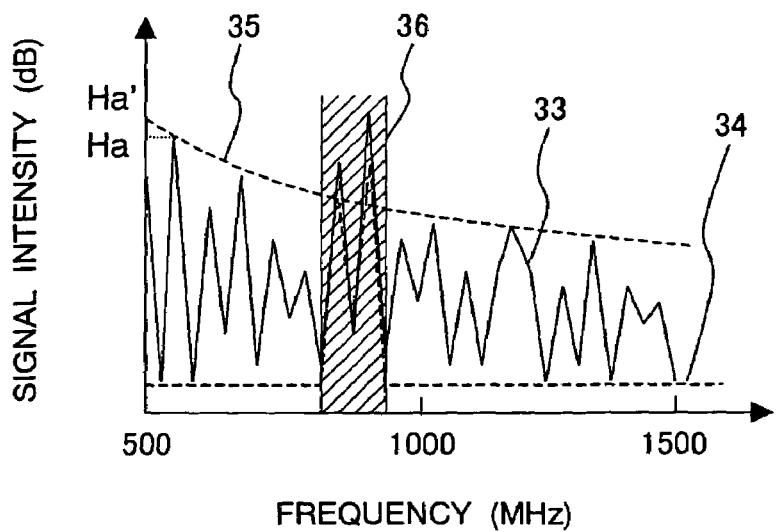
[FIG. 28] Characteristic curve showing masked frequency in case noise is caused

FIG. 28 shows the frequency-analyzed waveform indicating the frequency band in which noise is caused. Shaded portion represents the noise, and this portion is regarded as an out-of-range band and not considered. In the above conversion into the signal intensity at 500 MHz, the out-of-range band 36 due to noise is excluded from the conversion as shown in the figure.

In order to estimate the defect size further more accurately, the effect of the metallic container size (tank size) of the gas-insulated apparatus upon the frequency characteristic needs to be taken into account. Since the metallic container size varies by the voltage rating of the gas-insulated apparatus, the signal intensity of discharge varies even under the same condition if the tank size becomes larger. The relation between the tank size and signal intensity X of discharge is expressed by Formula (5), given that the tank radius is r.

$$X \propto 1/r \quad (5)$$

However, Formula (5) holds true where discharge is cause by the defect such as protrusion, particle caught on the spacer surface or void that has no relation with the metallic container or high-voltage conductor, but does not hold true in case of the discharge caused between the particle and electrode of the metallic container by the defect such as free particle or float electrode.

If the defect type determined by the defect type judging section 12 is protrusion, particle caught on the spacer surface or void, Formula (5) is employed to convert the tank size to a reference size. Then, in estimating the defect size in the defect size calculating section 14, the signal intensity (discharge intensity) calculated by the location determining section is converted into the signal intensity for the reference size by applying Formula (5).

What is claimed is:

1. A method of monitoring partial discharge in a gas-insulated apparatus and diagnosing a failure condition by sensing an intensity of a partial discharge signal caused by a defect, comprising the steps of:
   a) detecting a partial discharge signal caused by a defect by multiple sensors disposed apart from each other;
   b) frequency analyzing the detected partial discharge signal and judging a type of the defect based on a signal of the partial discharge signal which is synchronized with the frequency of the voltage applied to the gas-insulated apparatus by using a defect type database;
   c) calculating a location where a partial discharge occurred and a strength of the partial discharge based on the partial discharge signal detected by the multiple sensors;
   d) calculating a conductor surface field strength and a field unevenness factor at the location where the partial discharge occurred, based on the calculated position of the partial discharge, by using a structural dimension database; and
   e) estimating a size of the defect based on the intensity of the partial discharge and the calculated conductor surface field strength and the field unevenness factor at the location where the partial discharge occurred by using a defect size database corresponding to a type of defect within defect size databases provided for a plurality of types of defects.

2. A method of monitoring partial discharge in a gas-insulated apparatus and diagnosing a failure condition according to claim 1, wherein a defect location is determined from multiple sensed partial discharge signals and the signal intensity; and a discharge level at the location of the defect, is calculated from a signal attenuation between the defect location and partial discharge signal sensors.

3. A method of monitoring partial discharge in a gas-insulated apparatus and diagnosing a failure condition according to claim 1, wherein the defect size is estimated based on the analyzed waveform of a frequency analysis to the sensed partial discharge signal or on a voltage phase distribution of the partial discharge synchronized with the frequency of the voltage applied to the gas-insulated apparatus.

4. A method of monitoring partial discharge in a gas-insulated apparatus and diagnosing a failure condition according to claim 3, wherein the signal intensity of the partial discharge signal is a maximum frequency component of the analyzed waveform converted into a signal intensity of a predetermined reference frequency.

5. A method of monitoring partial discharge in a gas-insulated apparatus and diagnosing a failure condition according to claim 3, wherein the field distribution at the defect location is obtained from a correlation, predetermined for each type of defect, between the defect location, conductor surface field strength and field unevenness factor.

6. A method of monitoring partial discharge in a gas-insulated apparatus and diagnosing a failure condition according to claim 1, wherein the gas-insulated apparatus is provided with a metallic container having a high-voltage conductor, a circuit breaker, a disconnecting switch and a ground switch; and breakdown probability is calculated from an estimated defect size and an anticipated lightning surge, a disconnecting switch surge, a switching surge, or a overvoltage level, upon one-line ground failure and its occurrence ratio, all of which is then regarded as the breakdown probability of the gas-insulated apparatus to calculate the risk of breakdown.

7. A method of monitoring partial discharge in a gas-insulated apparatus and diagnosing a failure condition according to claim 1, wherein a risk of breakdown and breakdown time are estimated based on a dielectric breakdown characteristic of an estimated defect type and size in long time operation.

8. A partial discharge monitoring system of a gas-insulated apparatus comprising a tank having a high-voltage conductor, a circuit breaker, a disconnecting switch, a ground switch and multiple sensors for sensing an intensity of a partial discharge signal caused by a defect, the monitoring system comprising:
   a) a frequency analyzing section for analyzing the frequency of the sensed partial discharge signal;
   b) a judging section for estimating a type of the defect based on the analyzed waveform of the frequency analysis, or from a voltage phase distribution of the partial discharge synchronized with a frequency of a voltage applied to the gas-insulated apparatus;
   c) a location determining section for estimating defect location and signal intensity based on the partial frequency signal from the multiple sensors;
   d) means for calculating a conductor surface field strength and a field unevenness factor at the location where a partial discharge occurred, based on a calculated position of the partial discharge, by using a structural dimension database;
   e) and a defect size calculating section for estimating defect size for each estimated defect type based on the signal intensity and field distribution at the defect location, wherein the defect size calculating section estimates the defect size by the signal intensity and the field distribution based on field strength and field unevenness factor at the location of the defect by using a defect size database corresponding to a type of defect within defect size databases provided for a plurality of types of defects.

9. A partial discharge monitoring system of a gas-insulated apparatus according to claim 8, further comprising:
  a) a risk evaluating section for evaluating risk based on the defect size estimated by the defect size estimating section; and
  b) a check result displaying section for displaying the check result of the risk and a maintenance guidance of the gas-insulated apparatus.

* * * * *